(12) United States Patent
Jang

(10) Patent No.: US 10,629,259 B2
(45) Date of Patent: Apr. 21, 2020

(54) NON-VOLATILE MEMORY DEVICE AND ON-CHIP VALLEY SEARCH (OCVS) READ METHOD THEREOF

(71) Applicant: SAMSUNG ELECTRONICS CO., LTD., Suwon-si, Gyeonggi-do (KR)

(72) Inventor: Joon Suc Jang, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/108,665

(22) Filed: Aug. 22, 2018

(65) Prior Publication Data

US 2019/0214092 A1 Jul. 11, 2019

(30) Foreign Application Priority Data

Jan. 10, 2018 (KR) .................. 10-2018-0003407

(51) Int. Cl.
*G11C 11/56* (2006.01)
*G11C 16/04* (2006.01)
*G11C 16/26* (2006.01)
*G11C 11/413* (2006.01)

(52) U.S. Cl.
CPC ............ *G11C 11/56* (2013.01); *G11C 11/413* (2013.01); *G11C 16/04* (2013.01); *G11C 16/0483* (2013.01); *G11C 16/26* (2013.01)

(58) Field of Classification Search
CPC ..................... G11C 16/26; G11C 16/0483
See application file for complete search history.

(56) References Cited

U.S. PATENT DOCUMENTS

| 8,023,323 | B2 | 9/2011 | Kang et al. | |
|---|---|---|---|---|
| 8,406,053 | B1 | 3/2013 | Dutta et al. | |
| 8,850,292 | B2 | 9/2014 | Lee | |
| 9,036,417 | B2 | 5/2015 | Chen et al. | |
| 9,076,545 | B2 | 7/2015 | Mokhlesi | |
| 9,111,626 | B2 | 8/2015 | Kim et al. | |
| 9,117,536 | B2 | 8/2015 | Yoon et al. | |
| 9,754,683 | B2 | 9/2017 | Goldman et al. | |
| 2010/0296350 | A1* | 11/2010 | Kim ................... | G11C 11/5642 365/189.15 |
| 2014/0153331 | A1* | 6/2014 | Jang ................... | G11C 7/1039 365/185.03 |

* cited by examiner

*Primary Examiner* — Ajay Ojha
(74) *Attorney, Agent, or Firm* — F. Chau & Associates, LLC

(57) ABSTRACT

A non-volatile memory device includes a page buffer and a control logic. The page buffer includes a plurality of latch sets that latches first results of a plurality of first read operations according to a plurality of read signals. The first read operations identify a single page datum from among a plurality of page data of selected memory cells included in a plurality of memory cells. The control logic selects a portion of the read signals by comparing the first results of the first read operations, and resets remaining read signals that are not selected. The page buffer stores second results of second read operations according to the selected read signals, and third results of third read operations according to the reset remaining read signals.

19 Claims, 17 Drawing Sheets

1

NON-VOLATILE MEMORY DEVICE AND ON-CHIP VALLEY SEARCH (OCVS) READ METHOD THEREOF

CROSS-REFERENCE TO RELATED APPLICATIONS

This application claims priority under 35 U.S.C. § 119 to Korean Patent Application No. 10-2018-0003407 filed on Jan. 10, 2018, the disclosure of which is incorporated by reference herein in its entirety.

TECHNICAL FIELD

Exemplary embodiments of the present inventive concept relate to a non-volatile memory device and a read method thereof.

DISCUSSION OF THE RELATED ART

Semiconductor memory devices may be categorized as volatile semiconductor memory devices or non-volatile semiconductor memory devices. Volatile semiconductor memory devices have fast reading and writing speeds, but have a limitation in which stored data is lost when the power supply is cut off. In contrast, non-volatile semiconductor memory devices preserve data stored therein when the power supply is interrupted. Therefore, non-volatile semiconductor memory devices are used to store data that must be preserved.

A representative example of a non-volatile memory device is a flash memory device. A flash memory device is widely used as a voice and image data storage medium for information devices such as, for example, computers, mobile phones, smartphones, digital cameras, camcorders, voice recorders, MP3 players, personal digital assistants (PDAs), handheld computers (Handheld PCs), game machines, fax machines, scanners, printers, etc. In recent years, high capacity, high-speed input and output, and low power consumption technologies of nonvolatile memory devices have been actively researched for mounting in mobile devices such as smartphones.

SUMMARY

Exemplary embodiments of the present inventive concept provide a non-volatile memory device performing sensing multiple times to identify a specific state of a memory cell, and selecting optimal data from sensing results and outputting the optimal data, and a read method thereof.

According to an exemplary embodiment of the present inventive concept, a non-volatile memory device includes a page buffer and a control logic. The page buffer includes a plurality of latch sets that latches first results of a plurality of first read operations according to a plurality of read signals. The first read operations identify a single page datum from among a plurality of page data of selected memory cells included in a plurality of memory cells. The control logic selects a portion of the read signals by comparing the first results of the first read operations, and resets remaining read signals that are not selected. The page buffer stores second results of second read operations according to the selected read signals, and third results of third read operations according to the reset remaining read signals.

According to an exemplary embodiment of the present inventive concept, a non-volatile memory device includes a page buffer and a control logic. The page buffer includes a plurality of latch sets that sequentially performs primary read operations and secondary read operations according to primary read signals and secondary read signals, and that latches first results of the primary read operations and the secondary read operations. The latch sets identify a single page datum from among a plurality of page data of selected memory cells included in a plurality of memory cells. The control logic selects a portion of the primary read signals by comparing the first results of the primary read operations, and determines the secondary read signals based on the selected primary read signals. The page buffer initializes second results of the primary read operations corresponding to remaining primary read signals that have not been selected.

According to an exemplary embodiment of the present inventive concept, a reading method of a non-volatile memory device includes storing first results of primary read operations that identify a single page datum from among a plurality of page data of selected memory cells according to primary read signals. The method further includes selecting a portion of the primary read signals, and determining secondary read signals based on the selected primary read signals by comparing the first results of the primary read operations. The method further includes initializing second results of the primary read operations corresponding to remaining primary read signals that have not been selected. The method further includes storing third results of secondary read operations that identify the single page datum from among the plurality of page data according to the secondary read signals.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
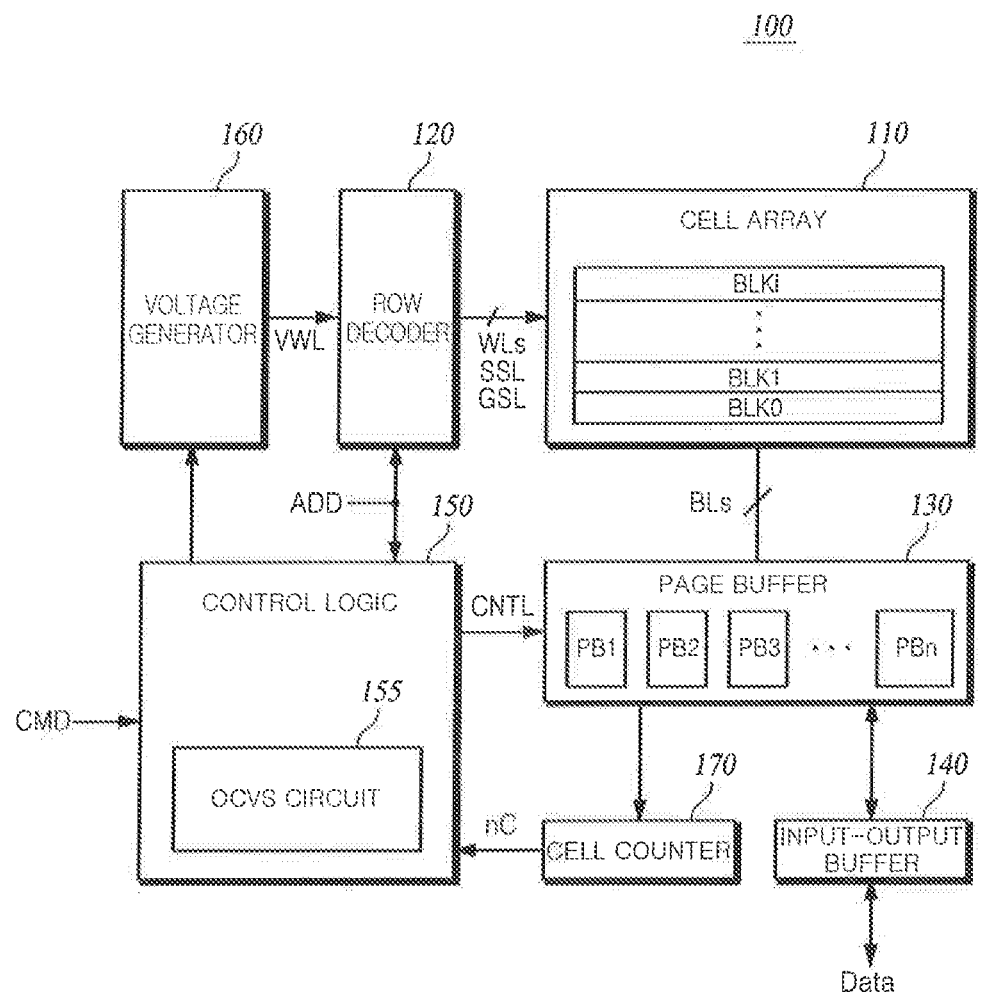
FIG. 1 is a block diagram of a non-volatile memory device according to an exemplary embodiment of the inventive concept.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms.

Exemplary embodiments of the present inventive concept provide a nonvolatile memory device for performing a data processing operation, and a method thereof, in which the occurrence of error bits is significantly reduced.

Hereinafter, a NAND flash memory device is used as an example of a non-volatile memory device to explain the features and functions of exemplary embodiments of the present inventive concept. However, exemplary embodiments of the present inventive concept are not limited thereto. For example, the technique of the present inventive concept can also be used for PRAM, MRAM, ReRAM, FRAM, a NOR flash memory, etc.

FIG. 1 is a block diagram of a non-volatile memory device according to an exemplary embodiment of the inventive concept.

Referring to FIG. 1, in an exemplary embodiment, a non-volatile memory device 100 includes a memory cell array 110, a row decoder 120 (also referred to herein as a row decoder circuit), a page buffer 130 (also referred to herein as a page buffer circuit), an input-output buffer 140 (also referred to herein as an input-output buffer circuit), a control logic 150 (also referred to herein as a control logic circuit), a voltage generator 160 (also referred to herein as a voltage generator circuit), and a cell counter 170 (also referred to herein as a cell counter circuit).

The memory cell array 110 is connected to the row decoder 120 through word lines WLs or select lines SSL and GSL. The memory cell array 110 is connected to the page buffer 130 through bit lines BLs. The memory cell array 110 includes a plurality of memory blocks BLK0 to BLKi, where i is an integer greater than or equal to 2. Each of the memory blocks BLK0 to BLKi may include a plurality of NAND cell strings. Each channel of the cell strings may be formed in a vertical or horizontal direction. The memory cell array 110 may include a plurality of memory cells forming a cell string. The plurality of memory cells may be programmed, erased, and read out by a voltage supplied to the bit line BLs or the word line WLs. A programming operation may be performed on the basis of a page, and an erasing operation may be performed on the basis of memory blocks BLK0 to BLKi. Each of the memory blocks BLK0 to BLKi may include a three-dimensional memory array.

The row decoder 120 may select one memory block from among the memory blocks of the memory cell array 110 in response to an address signal ADD. The row decoder 120 may select one word line WL from among the word lines WLs of a memory block in response to the address signal ADD. The row decoder 120 may transfer a word line voltage VWL, corresponding to an operation mode, to a word line of the selected memory block. During a programming operation, the row decoder 120 may transfer a program voltage Vpgm and a verification voltage Vfy to a selected word line (Selected WL), and may transfer a pass voltage Vpass to an unselected word line (Unselected WL). During a read operation, the row decoder 120 may transfer a selected read voltage Vrd to the selected word line (Selected WL), and may transfer an unselected read voltage Vread to the unselected word line (Unselected WL).

The page buffer 130 may be operated by at least one of a write driver and a sense amplifier. During a programming operation, the page buffer 130 may transfer a bit line voltage corresponding to data to be programmed to a bit line of the memory cell array 110. During a read operation, the page buffer 130 may sense data stored in a selected memory cell through a bit line BL. Each of a plurality of page buffers PB1 to PBn (where n is an integer greater than or equal to 2) included in the page buffer 130 may be connected to one or two bit lines.

Each of the plurality of page buffers PB1 to PBn may perform a latch operation of sensing and storing data of selected memory cells to perform an On-Chip Valley Search (OCVS) read operation. Each of the plurality of page buffers PB1 to PBn may perform a plurality of sensing operations to identify a state of one memory cell from among selected memory cells according to control of the control logic 150. For example, the control logic 150 may transmit a control signal CNTL to the page buffer 130 to cause the plurality of page buffers PB1 to PBn to perform a plurality of sensing operations.

Here, in the case that a physical page includes a plurality of bit pages, from identification of a state of one memory cell from among selected memory cells, a single page datum from among a plurality of page data forming a single bit page may be read. The plurality of page buffers PB1 to PBn may store data sensed through a plurality of sensing operations, respectively, and may select one piece of data from among a plurality of stored data. Each of the plurality of page buffers PB1 to PBn may perform sensing multiple times to identify a state of one memory cell from among a plurality of memory cells. That is, each of the plurality of page buffers PB1 to PBn may perform sensing multiple times to identify a single page datum from among a plurality of page data. Each of the plurality of page buffers PB1 to PBn may select or output optimal data from among a plurality of sensed data according to control of the control logic 150.

The input-output buffer 140 may provide data, provided from an external source, to the page buffer 130. Moreover, the input-output buffer 140 may provide a command CMD, provided from an external source, to the control logic 150, and may provide the address signal ADD, provided from an external source, to the control logic 150 or the row decoder 120. In addition, the input-output buffer 140 may output data latched by the page buffer 130 externally.

The control logic 150 may control the page buffer 130 and the row decoder 120 in response to the command CMD transferred from an external source through the input-output buffer 140. The control logic 150 may control the page buffer 130 and the row decoder 120 to perform program, read, and erase operations on selected memory cells according to the command CMD.

For example, the control logic 150 may control the page buffer 130 and the voltage generator 160 for an OCVS read operation according to an exemplary embodiment. The control logic 150 may control the page buffer 130 to perform a sensing operation multiple times to identify a specific state of selected memory cells. The control logic 150 may control the plurality of page buffers PB1 to PBn to store data, corresponding to sensing operations performed multiple times, in a plurality of latches provided in the plurality of page buffers PB1 to PBn, respectively. The control logic 150 may perform processing to select optimal data from among data sensed multiple times. For optimal data selection, the control logic 150 may refer to a count result nC provided from the cell counter 170. For example, the control logic 150 may control the page buffer 130 to select and output the nearest read result to a valley from among a plurality of sensing data. In exemplary embodiments, the control logic 150 includes an OCVS circuit 155 to perform the operation described above.

The voltage generator 160 may generate various types of word line voltages VWLs to be supplied to respective word lines, and a voltage to be supplied to a bulk in which memory cells are formed, for example, a well region, according to control of the control logic 150. The word line voltages to be supplied to respective word lines VWL may be, for example, a program voltage Vpgm, a pass voltage Vpass, selected and unselected read voltages Vrd and Vread, etc.

The cell counter 170 may count memory cells corresponding to a specific threshold voltage range from data sensed by the page buffer 130. For example, the cell counter 170 may count the number of memory cells having a threshold voltage in a specific threshold voltage range by processing data sensed and stored in each of the plurality of page buffers PB1 to PBn.

The non-volatile memory device 100 according to an exemplary embodiment may perform a plurality of sensing operations on selected memory cells. The non-volatile memory device 100 may select optimal data from among a plurality of sensing data, and may output the selected data to the outside. According to an exemplary embodiment, a non-volatile memory device may select data sensed by an optimum read voltage, thereby providing data with high reliability.

Figure 2:
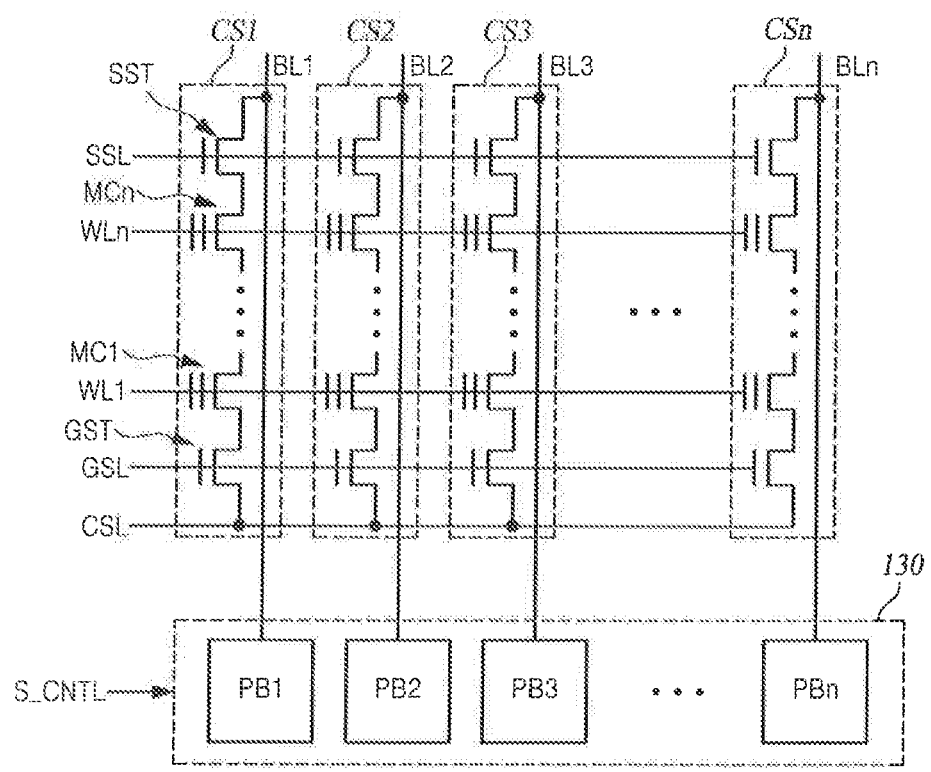
FIG. 2 is a block diagram illustrating an exemplary configuration of a cell array and a page buffer of FIG. 1.

FIG. 2 is a block diagram illustrating an exemplary configuration of the memory cell array and the page buffer of FIG. 1.

Referring to FIG. 2, in an exemplary embodiment, the page buffers PB1 to PBn are connected to the bit lines BL1 to BLn, respectively. The bit lines BL1 to BL are connected to cell strings CS1 to CSn.

The cell strings CS1 to CSn, which are included in the memory cell array 110, may be connected to the bit lines BL1 to BLn through string selection transistors SST, respectively. A gate of each of the string selection transistors SST may be connected to a string selection line SSL. In addition, the cell strings CS1 to CSn may be connected to a common source line CSL through ground selection transistors GST, respectively. A gate of each of the ground selection transistors GST may be connected to a ground selection line GSL.

For example, the page buffer PB1 is connected to the cell string CS1 through the bit line BL1. The page buffer PB1 may set up or precharge the bit line BL1 during a programming operation. During a read operation, the page buffer PB1 may precharge the bit line BL1, and may sense whether a selected memory cell is turned on or off. The page buffer PB1 may include transistors for supplying a power supply voltage to a bit line. The page buffer PB1 may receive a control signal S_CNTL for controlling transistors from the control logic 150. The control signal S_CNTL may include a plurality of control signals BLSHF and BLSLT. By way of the control signals BLSHF and BLSLT, the bit lines BL1 to BLn may be precharged and developed.

Figure 3:
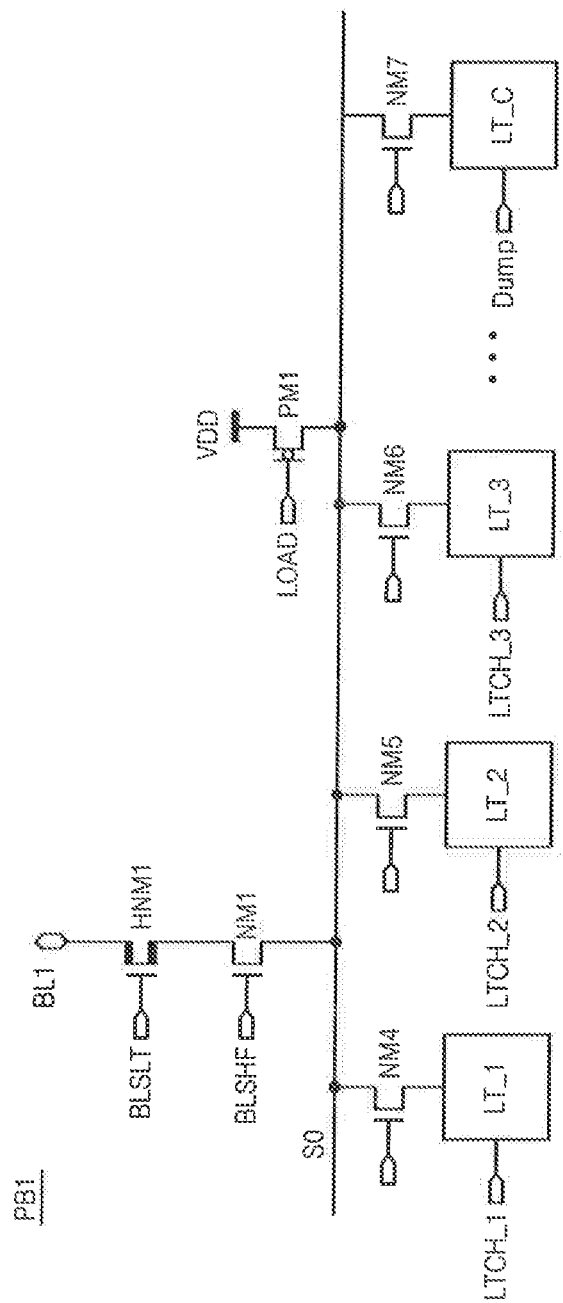
FIG. 3 is a schematic block diagram of a page buffer of FIGS. 1 and 2.

FIG. 3 is a schematic block diagram of a page buffer of FIGS. 1 and 2 according to an exemplary embodiment of the inventive concept.

Referring to FIG. 3, in an exemplary embodiment, a page buffer PB1, which is connected to a bit line BL1, is connected to memory cells of a cell string (e.g., memory cells MC1 to MCn of cell string CS1, as shown in FIG. 2). The page buffer PB1 includes a sensing node SO connected to the bit line BL1. The page buffer PB1 includes a plurality of latches LT_1, LT_2, LT_3, . . . , and LT_C connected to the sensing node SO (where C is an integer greater than or equal to 4). The plurality of latches LT_1, LT_2, LT_3, . . . , and LT_C are connected to the sensing node SO via transistors NM4, NM5, NM6, and NM7, respectively. In FIG. 3, VDD refers to a power supply voltage.

During a read operation, the bit line BL1 may be precharged by the control logic 150. For example, when a load signal LOAD and a control signal BLSHF are activated, the bit line BL may be precharged to a specific level VBL. In this case, a state in which a high-voltage transistor HNM1 is turned on may be maintained by a bit line selection signal BLSLT.

When the load signal LOAD is deactivated, a charge that is charged in the sensing node SO may flow to the bit line BL1 through a transistor NM1, which is turned on by the control signal BLSHF. For example, a develop operation, in which a potential change of the sensing node SO occurs, may be performed. If a selected memory cell is an On-Cell, a charge that is charged in the sensing node SO may be discharged to the common source line CSL through the bit line BL and a channel of a string. In this case, as a current flowing from the sensing node SO to the bit line BL is relatively high, a speed of a voltage drop of the sensing node SO is relatively fast. Alternatively, if the selected memory cell is an Off-Cell, it is difficult for a charge that is charged in the sensing node SO to be discharged to the common source line CSL through the bit line BL. Thus, as a current flowing from the sensing node SO to the bit line BL is relatively low, a speed of a voltage drop of the sensing node SO is relatively slow.

The plurality of latches LT_1, LT_2, LT_3, . . . , and LT_C may receive latch control signals LTCH_1, LTCH_2, LTCH_3, . . . , and Dump for sensing and storing a state in which the sensing node SO is developed. The plurality of latches LT_1, LT_2, LT_3, . . . , and LT_C may sense selected memory cells multiple times according to the latch control signals LTCH_1, LTCH_2, LTCH_3, . . . , and Dump, and may store a plurality of sensed data. For example, the latch control signals LTCH_1, LTCH_2, LTCH_3, . . . , and Dump may be provided sequentially.

According to an exemplary embodiment, the plurality of latches LT_1, LT_2, LT_3, . . . , and LT_C may perform a latch operation of sensing memory cells multiple times, and storing a plurality of sensed data to identify a state of one memory cell from among selected memory cells. For example, the plurality of latches LT_1, LT_2, LT_3, ..., and LT_C may perform a latch operation of sensing memory cells multiple times, and storing a plurality of sensed data to identify a single page datum from among a plurality of page data during an OCVS read operation. During an OCVS read operation, according to a plurality of read signals (e.g., a read signal set), read voltages having a plurality of different levels may be supplied to word lines of selected memory cells, or a plurality of latch signals may be supplied to a plurality of latches at different timings. According to a plurality of read signals, an indication of whether a selected memory cell is turned on or off may be stored sequentially in the plurality of latches LT_1, LT_2, LT_3, ..., and LT_C. Here, a read signal may be understood as a control signal for determining a level of a read voltage or a latch point of a latch operation. For example, a read signal may determine a level of a read voltage or a latch point of a latch operation. Moreover, as will be described later, a change in a latch point may have an effect of changing a level of a read voltage. Hereinafter, for convenience of description, an example will be described in which the term of a level of a read signal mixed with the term of a level of a read voltage is used.

The cell counter 170 may count the number of memory cells in which threshold voltages are located between read voltages having different levels using data stored in the plurality of latches LT_1, LT_2, LT_3, ..., and LT_C. For example, it is assumed that sensing data by a first read voltage is stored in first latches LT_1 of each of the page buffers PB1 to PBn, and sensing data by a second read voltage is stored in second latches LT_2 of each of the page buffers PB1 to PBn. Here, the first latches LT_1 of each of the page buffers PB1 to PBn may be referred to as a first latch set, and the second latches LT_2 of each of the page buffers PB1 to PBn may be referred to as a second latch set. When an exclusive-OR (XOR) operation between bits stored in the first latches LT_1 of each of the page buffers PB1 to PBn and bits stored in the second latches LT_2 of each of the page buffers PB1 to PBn is performed, the number of memory cells having a threshold voltage between a first read voltage and a second read voltage may be calculated. Moreover, according to an exemplary embodiment, by using a current comparator in the form of a differential amplifier according to a value of bits stored in each of a plurality of latches, calculation and comparison of the number of memory cells having a threshold voltage between a first read voltage and a second read voltage may be performed.

Any one latch, for example, a latch LT_1, may be controlled to sequentially latch only a state of the sensing node SO, and each of a plurality of latches LT_2, LT_3, ..., and LT_C may be controlled to allow sensed data to be copied from the latch LT_1. Moreover, any one latch, for example, a latch LT_C, may be used for outputting data of any one selected latch from among a plurality of latches.

Figure 4:
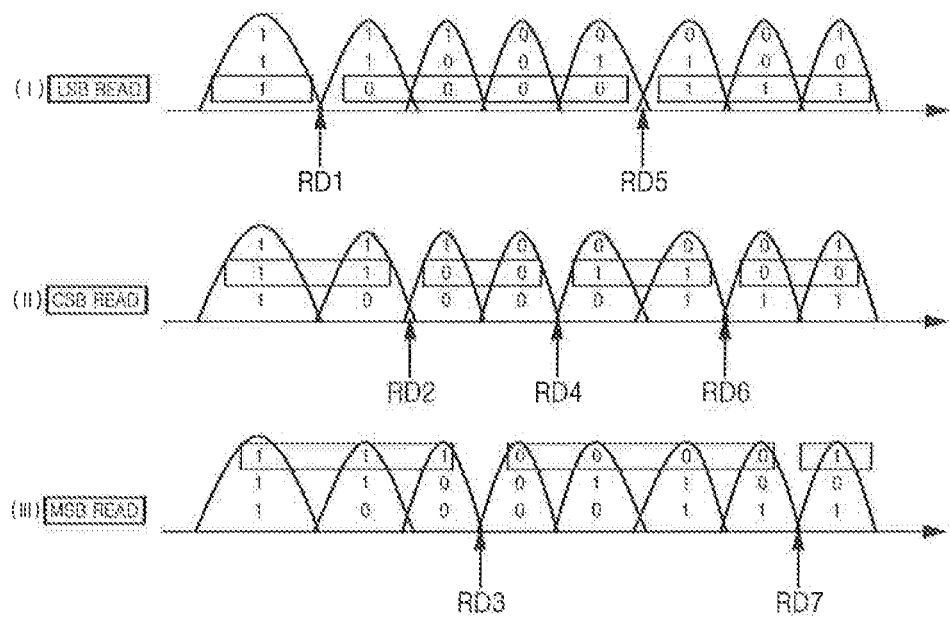
FIG. 4 is a view illustrating a normal read method of a memory cell.

FIG. 4 is a view illustrating a normal read method of a memory cell according to a comparative example.

Referring to FIG. 4, a read method to read a page of a triple level cell (TLC) for storing 3-bit data per cell is illustrated by way of example. Thereafter, it is assumed that a memory cell is a triple level cell (TLC), and an operation of the present inventive concept is illustrated with reference to a triple level cell (TLC). However, exemplary embodiments of the inventive concept are not limited thereto. For example, a method to be described later is also applied to a quadruple level cell (QLC) which can store 4-bit data per cell, and a multilevel cell which can store 4 or more bit data.

A triple level cell may include a physical page including a plurality of logical pages. For example, the plurality of logical pages may include a least significant bit (LSB) page, a center bit (CSB) page, and a most significant bit (MSB) page.

To read a least significant bit (LSB) page, a read voltage RD1 may be supplied to a word line of selected memory cells. A memory cell having a threshold voltage lower than the read voltage RD1 is stored as a logic '1,' and a memory cell having a threshold voltage equal to or higher than the read voltage RD1 is stored as a logic '0.' Then, a read voltage RD5 may be supplied to a word line of selected memory cells. In a memory cell having a threshold voltage lower than the read voltage RD5, a logic '0,' previously stored, is maintained. In a memory cell having a threshold voltage equal to or higher than the read voltage RD5, a logic '0,' previously stored, is toggled to a logic '1.' Moreover, after such a process is completed, a read result of a least significant bit (LSB) page may be output.

To read a center bit (CSB) page, a read voltage RD2 may be supplied to a word line of selected memory cells. A memory cell having a threshold voltage lower than the read voltage RD2 is stored as a logic '1,' and a memory cell having a threshold voltage equal to or higher than the read voltage RD2 is stored as a logic '0.' Then, a read voltage RD4 may be supplied to a word line of selected memory cells. In a memory cell having a threshold voltage lower than the read voltage RD4, a logic '0,' previously stored, is maintained. In a memory cell having a threshold voltage equal to or higher than the read voltage RD4, a logic '0,' previously stored, is toggled to a logic '1.' Finally, a read voltage RD6 may be supplied to a word line of selected memory cells. In a memory cell having a threshold voltage lower than the read voltage RD6, a logic value, previously sensed, is maintained. A memory cell having a threshold voltage equal to or higher than the read voltage RD6 may be toggled to a logic '0.' Moreover, after such a process is completed, a read result of a most significant bit (MSB) page may be output.

To read a most significant bit (MSB) page, a read voltage RD3 may be supplied to a word line of selected memory cells. A memory cell having a threshold voltage lower than the read voltage RD3 is stored as a logic '1,' and a sensing result of a memory cell having a threshold voltage equal to or higher than the read voltage RD3 is stored as a logic '0.' Then, a read voltage RD7 may be supplied to a word line of selected memory cells. In a memory cell having a threshold voltage lower than the read voltage RD7, a logic '0,' previously stored, is maintained. In a memory cell having a threshold voltage equal to or higher than the read voltage RD7, a logic '0,' previously stored, is toggled to a logic '1.' Moreover, after such a process is completed, a read result of a most significant bit (MSB) page may be output.

In this case, during a normal read operation, by degradation of a memory cell, a read fail may occur. The non-volatile memory device 100 according to exemplary embodiments of the present inventive concept may perform an OCVS read operation for providing high reliability according to an external request or an internal determination, and may provide a result thereof to the outside.

Figure 5:
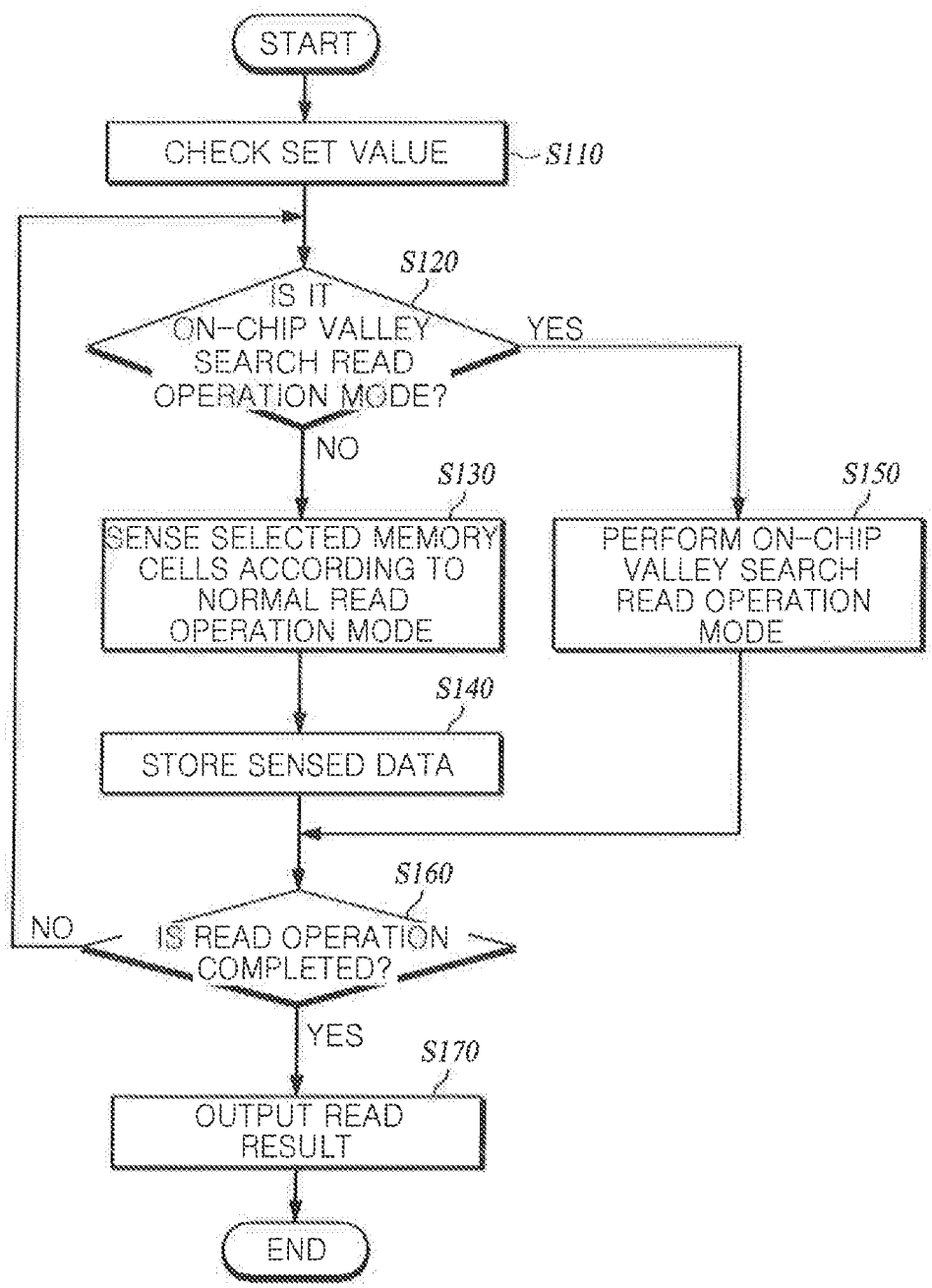
FIG. 5 is a flow diagram of a read method of a non-volatile memory device according to an exemplary embodiment of the inventive concept.

FIG. 5 is a flow diagram of a read method of a non-volatile memory device according to an exemplary embodiment of the inventive concept.

Referring to FIG. 5, the non-volatile memory device 100 may perform any one read operation of a normal read operation mode and an OCVS read operation mode according to a set read operation mode.

According to an exemplary embodiment, in operation S110, the non-volatile memory device 100 checks a set value related to a requested read operation. For example, the control logic 150 may check whether a read requested page (Page) is a most significant bit (MSB), a center bit (CSB), and a least significant bit (LSB). Moreover, the control logic 150 may check the order of application of a read signal for reading a selected page. In addition, the control logic 150 may check whether a mode of a current read operation is a normal read operation mode or an OCVS read operation mode. In a normal read operation mode, to identify a state of one with respect to a memory cell (e.g., to identify a single page datum from among a plurality of page data), a read signal may be provided once. Alternatively, in an OCVS read operation mode, read signals having different levels are provided multiple times to identify the single page datum from among the plurality of page data, and a comparison operation with respect to sensing data may be performed.

In operation S120, a determination is made as to whether a read operation mode is an OCVS read operation mode. When a read operation mode is not an OCVS read operation mode, the control logic 150 may control the voltage generator 160 and the page buffer 130 in operation S130 to perform a normal read operation of providing a read signal once. Thus, a read voltage corresponding to a read signal is provided to a word line of selected memory cells, and whether memory cells are turned on or off is sensed in the page buffer 130. Then, in operation S140, sensed data is stored in a latch of the page buffer 130. Alternatively, when a read operation mode is an OCVS read operation mode, the control logic 150 may control the voltage generator 160 and the page buffer 130 in operation S150 to perform an OCVS read operation of providing a read signal multiple times. In an OCVS read operation mode, according to a plurality of read signals (e.g., a read signal set), read voltages having a plurality of different levels may be supplied to word lines of selected memory cells, or a plurality of latch signals may be supplied to a plurality of latches at different timings. In operation S160, the control logic 150 determines whether a read operation is completed. When it is determined that a read operation on memory cells of a selected page is completed, a reading result calculated by a normal operation mode or an OCVS read operation mode is output to the outside in operation S170. When an additional read operation on selected memory cells is required, the method may return to operation S120.

Figure 6:
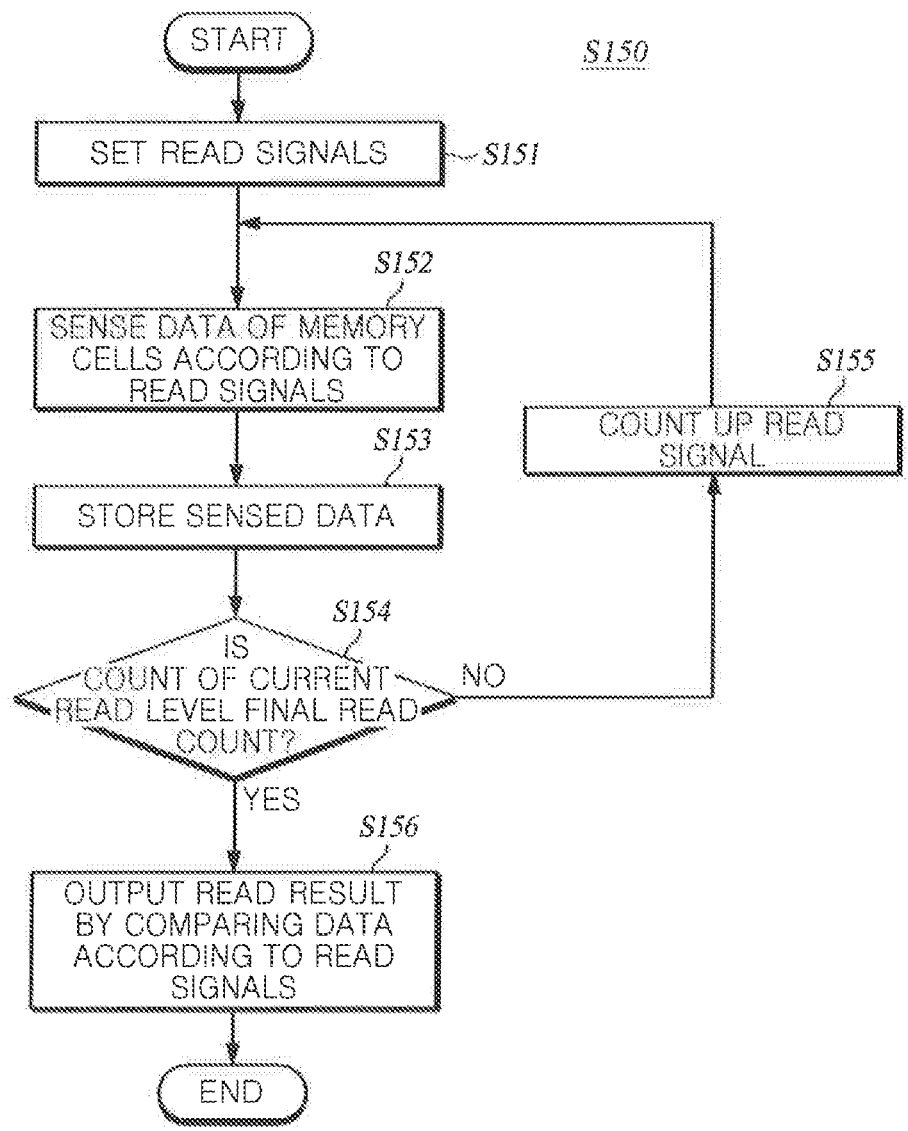
FIG. 6 is a flow diagram of an OCVS read operation according to an exemplary embodiment of the inventive concept.

FIG. 6 is a flow diagram of an OCVS read operation according to an exemplary embodiment of the inventive concept.

Referring to FIG. 6, the OCVS read operation illustrated in operation S150 of FIG. 5 is illustrated according to an exemplary embodiment.

In operation S151, read signals are set. The read signals may include information on a read count, and may include information on a level of read signals determining an interval between read signals. The read count may refer to a state of a specific one memory cell from among a plurality of selected memory cells (e.g., the number of searches for a single page datum from among a plurality of page data). For example, when selected memory cells are a triple level cell (TLC), a read count refers to the number of times a read signal for identifying an erase state E0 of a least significant bit (LSB) page and a program state P1. That is, the read count may refer to the number of times read voltages having different levels are applied in a threshold voltage section between the erase state E0 and the program state P1.

Moreover, the read count may refer to the number of data latches performed at different develop timings of a sensing node while the same read voltage is provided to selected memory cells. Here, a read count may be set as at least two times. Moreover, an interval between read signals may refer to a voltage interval between read voltages having different levels, or a time interval between data latching operations performed at different develop timings.

In operation S152, data of selected memory cells are sensed according to read signals. For example, according to the number of times read voltages are supplied and a voltage interval between read voltages, data of selected memory cells may be sensed. Alternatively, according to the number of times data latching is performed at different develop timings and a time interval between data latching operations, data of selected memory cells may be sensed.

In operation S153, the sensed data are stored in a latch. Here, data obtained by different read signals may be sensed and stored through different latches.

In operation S154, whether a current read count is a final read count having been set is determined. The final read count may correspond to a value set in operation S151. When a read count of a currently performed read operation is not a final read count, the method proceeds to operation S155. Alternatively, when a read count of a currently performed read operation corresponds to a final read count, the method proceeds to operation S156.

In operation S155, a read signal is counted up. To sense and store data obtained by the counted up read signal, operations S152 and S153 are performed. In operation S156, data obtained by different read signals are compared, so any one read result may be output, and a selected read result may be output.

Figure 7:
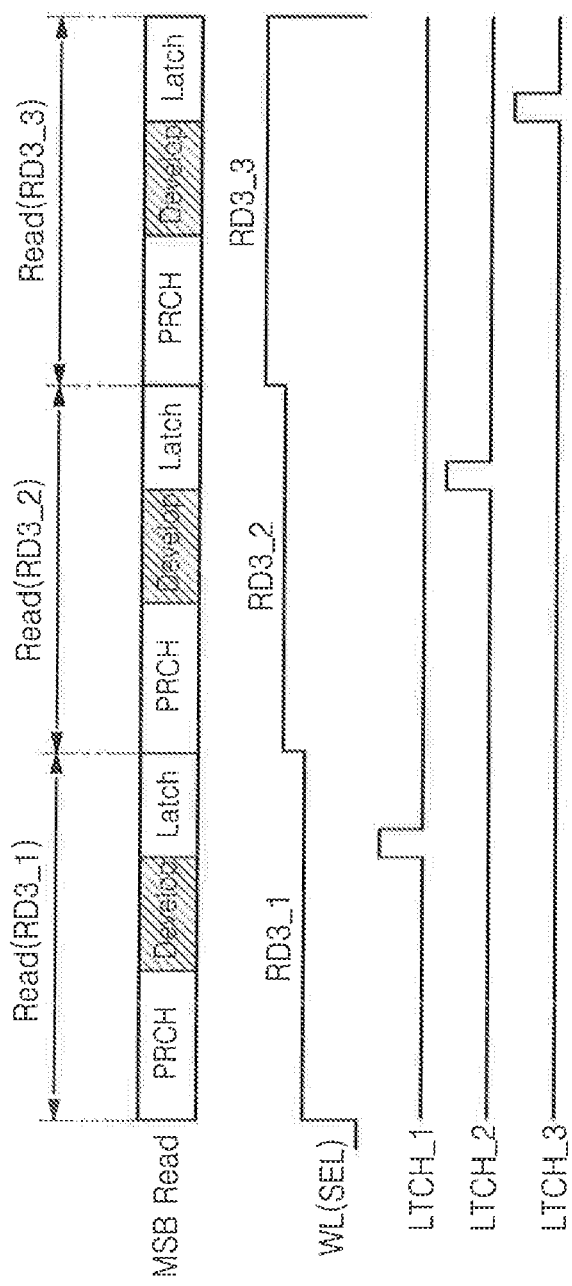
FIG. 7 is a timing diagram illustrating an OCVS read operation by read voltages having different levels according to an exemplary embodiment of the inventive concept.

FIG. 7 is a timing diagram illustrating an OCVS read operation by read voltages having different levels according to an exemplary embodiment of the inventive concept.

Referring to FIG. 7, a read voltage provided to a word line for an OCVS read operation may be varied. To illustrate an exemplary embodiment, a case in which an OCVS read operation is applied to a most significant bit (MSB) page of a triple level cell (TLC) will be described by way of example.

For an OCVS read operation of the most significant bit (MSB) page, first, a read voltage RD3_1 may be applied to a word line of selected memory cells. In addition, by way of each of the page buffers PB1 to PBn, at a point in which precharge (PRCH) with respect to a bit line and a sensing node and develop are completed, a first latch signal LTCH_1 may be activated. In this case, data corresponding to the read voltage RD3_1 may be stored in a first latch set.

Then, a read voltage RD3_2 may be applied to a word line of selected memory cells. The read voltage RD3_2 may be higher than the read voltage RD3_1, but may correspond to a voltage for identifying the same state. By way of each of the page buffers PB1 to PBn, at a point in which precharge (PRCH) with respect to a bit line and a sensing node and develop are completed, a second latch signal LTCH_2 may be activated. In this case, data corresponding to the read voltage RD3_2 may be stored in a second latch set of the page buffers PB1 to PBn.

Moreover, a read voltage RD3_3 may be applied to a word line of selected memory cells. The read voltage RD3_3 may be higher than the read voltage RD3_2, but may correspond to a voltage for identifying the same state as the read voltage RD3_1 and the read voltage RD3_2. By way of each of the page buffers PB1 to PBn, at a point in which precharge (PRCH) with respect to a bit line and a sensing node and develop are completed, a third latch signal LTCH_3 may be activated. In this case, data corresponding to the read voltage RD3_3 may be stored in a third latch set. When results stored in the first to third latch sets are compared thereafter, any one latch set may be selected.

Figure 8A:
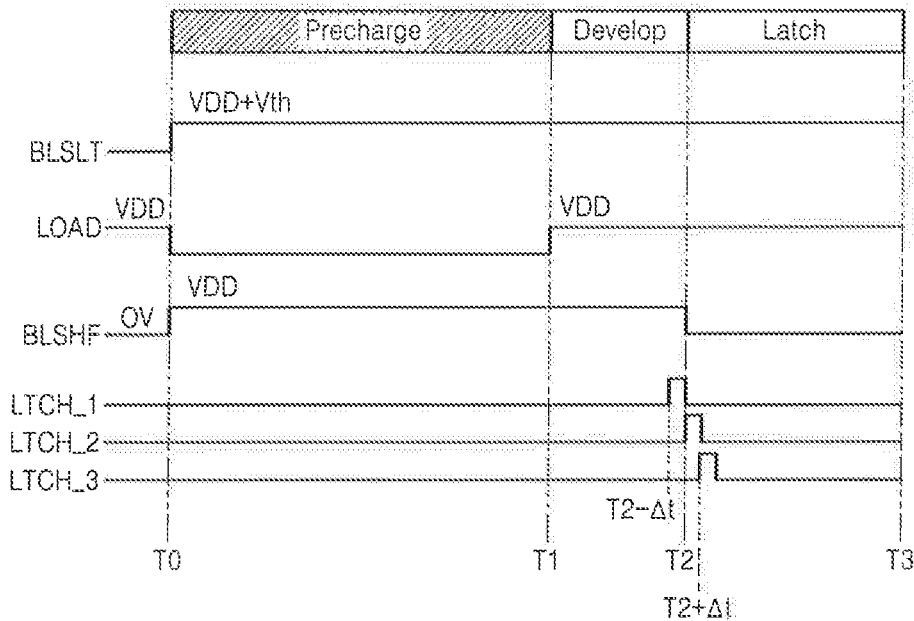
FIG. 8A is a timing diagram illustrating an OCVS read operation by a latch signal provided at different timings according to an exemplary embodiment of the inventive concept.

FIG. 8A is a timing diagram illustrating an OCVS read operation by a latch signal provided at different timings according to an exemplary embodiment of the inventive concept.

Referring to FIGS. 3 and 8A, an OCVS read operation, performed using a method of sensing a sensing node at different develop timings, and storing sensing data multiple times, will be described in detail.

A precharge operation is performed from a time T0 to a time T1. For precharge, bit lines BL1 to BLn and sensing nodes Sos, which are connected to a plurality of page buffers PB1 to PBn, are charged. For example, when control signals BLSHF and BLSLT as well as the load signal LOAD are activated, each of the sensing node SO and the bit line BL is precharged to a specific level.

At a time T1, when the load signal LOAD is deactivated to a high level, a PMOS transistor PM1 (see FIG. 3) is blocked so that current supply from a power supply voltage VDD (see FIG. 3) to the sensing node SO is blocked. As a result, a level of the sensing node SO is changed according to a magnitude of a current flowing to the bit line BL depending on whether a memory cell is turned on or off. When a selected memory cell is an on-cell, a current flowing to a bit line is relatively high. Thus, a level of the sensing node SO drops relatively quickly. Alternatively, when a selected memory cell is an off-cell, a level of the sensing node SO may be maintained at a substantially constant level.

However, memory cells distributed around a valley may be memory cells located at a boundary between an on-cell and an off-cell. Thus, identification of an on-cell or an off-cell from among the cells described above may vary depending on a develop point. For example, even when a develop point is slightly reduced, memory cells distributed around a valley may be identified as an off-cell. That is, when a develop point is advanced, an effect of sensing by increasing a read voltage may be provided to memory cells having a threshold voltage with a level similar to that of a read voltage provided to a word line. Alternatively, when a develop point is delayed, an effect of sensing by lowering a read voltage may be provided to memory cells having a threshold voltage around a read voltage. Thus, sensing the sensing node SO multiple times at different develop timings may have an effect of precharging and sensing a bit line by varying a word line voltage.

At a point advanced by Δt based on a time T2 (which is between time T1 and time T3), a control signal LTCH_1 is activated. For example, under the same read voltage conditions, a control signal LTCH_1 for latching a logical value corresponding to a state of a sensing node SO is provided to a first latch LT_1 of each of the page buffers PB1 to PBn. In addition, at the time T2, a control signal LTCH_2 for latching a state of a sensing node SO is provided to a second latch LT_2 of each of the page buffers PB1 to PBn. In addition, at a point passing by Δt based on time T2, a control signal LTCH_3 for latching a state of a sensing node SO is provided to a third latch LT_3 of each of the page buffers PB1 to PBn. In FIG. 8A, VDD refers to a supply voltage and Vth refers to the threshold voltage.

Figure 8B:
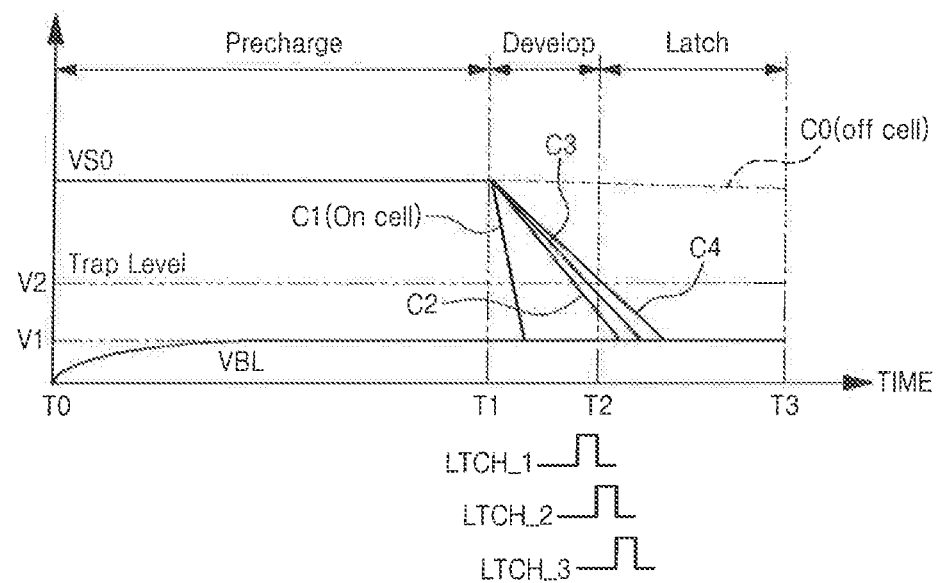
FIG. 8B is a waveform diagram illustrating a change in the level of a sensing node under conditions of control signals of FIG. 8A.

FIG. 8B is a waveform diagram illustrating a change in the level of a sensing node under conditions of control signals of FIG. 8A.

Referring to FIG. 8B, a change in a level of the sensing node SO according to a threshold voltage level of a memory cell and a latch result according to a develop point are schematically illustrated. A section from a time T0 to a time T1 is referred to as a precharge section (Precharge), a section from the time T1 to a time T2 is referred to as a develop section (Develop), and a section between the time T2 and a time T3 is referred to as a latch section (Latch). As illustrated in FIG. 8A, a load signal LOAD is deactivated in a develop section, while a control signal BLSHF is deactivated in a latch section.

In a precharge section (Precharge), the load signal LOAD and the control signal BLSHF are activated, so that a bit line and a sensing node are precharged. In a precharge section (Precharge), a bit line voltage VBL is charged to a first voltage level V1. In the precharge section (Precharge), the sensing node SO is charged to a sensing node voltage VSO.

At the time T1 in which a develop section (Develop) starts, the load signal LOAD is deactivated. In the section described above, an active state of the control signal BLSHF remains. Thus, according to a threshold voltage state of a memory cell, a charge charged in the sensing node SO moves to the bit line BL.

In a case of a memory cell in a strong off state (Strong off Cell) in which a threshold voltage is relatively higher than a read voltage, a change in a level of the sensing node SO is relatively low. A change in potential of the sensing node SO of a strong off-cell in a develop section is illustrated by a dotted line (C0). In a case of a memory cell in a strong on state (Strong On Cell) in which a threshold voltage is relatively lower than a read voltage, a change in a level of the sensing node SO is relatively high. A change in potential of the sensing node SO of a strong on-cell in a develop section is illustrated by a solid line (C1). In a case of a strong off-cell or a strong on-cell, it is not significantly affected by a slight change in develop time.

A change in potential of the sensing node SO, sensing memory cells in which a threshold voltage is located around a read voltage, is illustrated by each of solid lines C2, C3, and C4. The solid line C2 shows a develop trend of a memory cell having a threshold voltage slightly lower than a read voltage. The solid line C3 shows a develop trend of a memory cell having a threshold voltage of which a level is substantially equal to that of a read voltage. The solid line C4 shows a develop trend of a memory cell having a threshold voltage slightly higher than a read voltage.

The first latch signal LTCH_1 for latching the sensing node SO of memory cells by advancing a latch point by the reference time based on time T2 is provided. When sensing nodes are latched by the first latch signal LTCH_1, a strong off-cell and a strong on-cell are latched in a logical value corresponding to each of an off-cell and an on-cell. However, memory cells corresponding to the solid line C2 and in which a threshold voltage is relatively low are latched in a logical value corresponding to an on-cell, while memory cells corresponding to the solid lines C3 and C4 are latched in a logical value corresponding to an off-cell.

When sensing nodes are latched by the second latch signal LTCH_2, in a manner similar to the first latch signal LTCH_1, a strong off-cell (corresponding to C0) and a strong on-cell (corresponding to C1) may be latched in a logic '0' and a logic '1,' respectively. However, memory cells having a threshold voltage corresponding to the solid line C2 may be latched in a logical value corresponding to an on-cell. Alternatively, a memory cell corresponding to the solid line C3 is latched in potential of a sensing node SO of a trap level V2 by the second latch signal LTCH_2. That is, a logic '0' and a logic '1' may not be clear. Memory cells corresponding to the solid line C4 are latched in a logical value corresponding to an off-cell.

When sensing nodes SO are latched by the third latch signal LTCH_3, in a manner similar to the first latch signal LTCH_1, a strong off-cell (C0) and a strong on-cell (C1) may be latched in a logic '0' and a logic '1,' respectively. However, memory cells having a threshold voltage corresponding to the solid lines C2 and C3 are latched in a logical value '1' corresponding to an on-cell, while a memory cell corresponding to the solid line C4 is latched in a logical value '0' corresponding to an off-cell.

As described above, a method of latching a state of the sensing node SO at different develop timings to identify a state of one memory cell from among a plurality of memory cells is illustrated. An effect similar to providing read voltages having different levels to a word line substantially according to a develop point may be provided.

Figure 9:
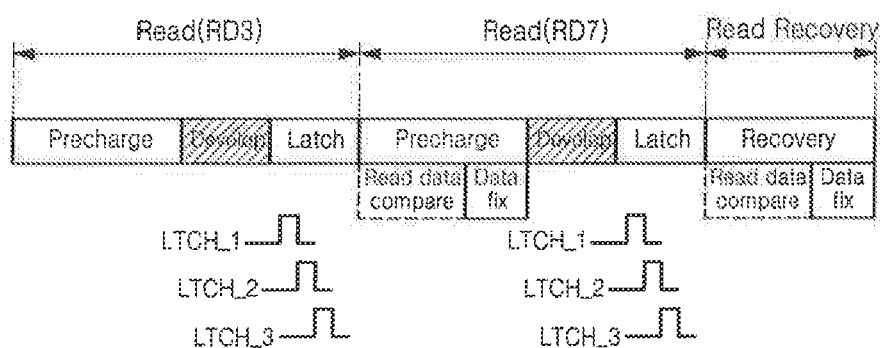
FIG. 9 is a timing diagram illustrating an example in which an OCVS read operation according to an exemplary embodiment of FIGS. 8A and 8B is applied to a most significant bit page of a triple level cell (TLC).

FIG. 9 is a timing diagram illustrating an example in which an OCVS read operation according to an exemplary embodiment of FIGS. 8A and 8B is applied to a most significant bit page of a triple level cell (TLC).

Referring to FIG. 9, to read a most significant bit (MSB) page of a triple level cell (TLC) in an OCVS method, a read procedure by a read voltage RD3 and a read procedure by a read voltage RD7 may proceed. Then, a read recovery in which a page buffer and a voltage of a word line are initialized may be performed.

First, for an OCVS read operation by the read voltage RD3, a bit line and a sensing node SO are precharged. A read voltage RD3 is provided to a word line of selected memory cells. When the precharge is completed, in page buffers PB0 to PBn−1 (see FIG. 2), a develop operation in which a change in potential of the sensing node SO according to a state of a memory cell occurs may be performed. In addition, states of selected memory cells may be sequentially latched by latch signals LTCH_1, LTCH_2, and LTCH_3 provided at different develop timings. In this case, latched data may be stored in a plurality of latches provided in each of the page buffers PB1 to PBn.

Then, for an OCVS read operation by the read voltage RD7, a bit line and a sensing node SO are precharged. A read voltage RD7 is provided to a word line of selected memory cells. When the precharge is completed, in page buffers PB1 to PBn−1, a develop operation in which a change in potential of the sensing node SO according to a state of a memory cell occurs may be performed. In addition, states of selected memory cells are latched by latch signals LTCH_1, LTCH_2, and LTCH_3 provided at different develop timings, and latched data may be stored in a plurality of latches provided in each of the page buffers PB1 to PBn.

In a precharge section of a read operation by the read voltage RD7, a comparison and selection operation on data latched in latches of each of the page buffers PB1 to PBn may be performed. For example, by comparing data latched by the first latch signal LTCH_1 with data latched by the second latch signal LTCH_2, the number of memory cells may be counted. That is, by comparing data latched by the second latch signal LTCH_2 with data latched by the third latch signal LTCH_3, the number of memory cells may be counted. By comparing the number of cells having been counted, one data set from among a plurality of data sets latched by each of latch signals LTCH_1, LTCH_2, and LTCH_3 may be selected. The operation described above is illustrated as "Data fix" in FIG. 9.

When an OCVS read operation by the read voltage RD7 is completed, in addition to read recovery, a data comparison and selection operation may be performed in a pipelined manner. In a read recovery section, a bit line and the sensing nodes SO may be restored to an initial voltage level. In this case, under conditions of a read voltage RD7, one data set from among a plurality of data sets latched by each of latch signals LTCH_1, LTCH_2, and LTCH_3 may be selected through a comparison operation. In addition, by processing an OCVS read operation result by the read voltage RD3, and an OCVS read operation result by the read voltage RD7, the most significant bit (MSB) data may be determined.

Figure 10A:
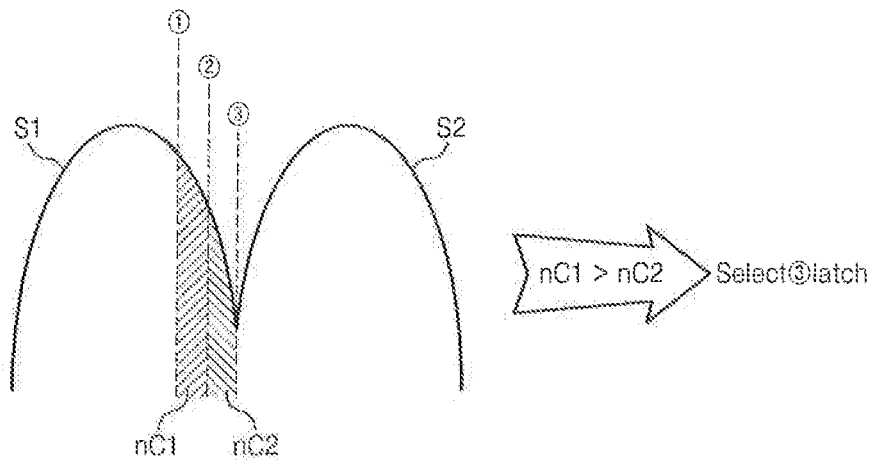
FIGS. 10A, 10B, and 10C are respective views showing a method of selecting data using a latch result of a sensing node SO three times.
Figure 10B:
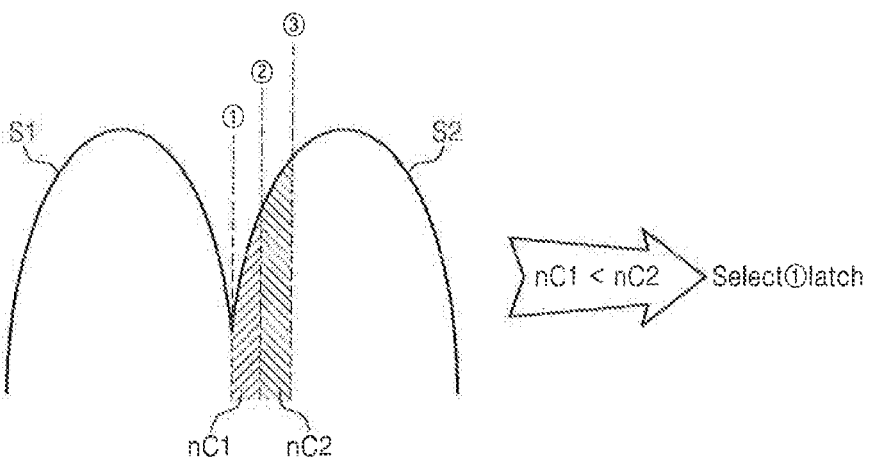
Figure 10C:
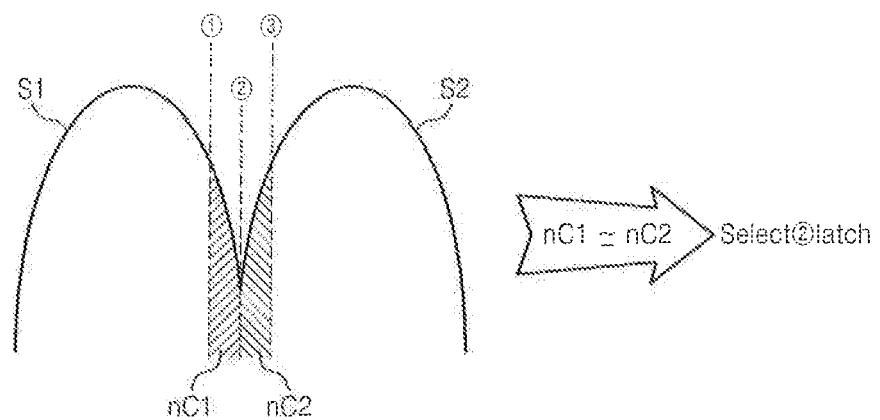

FIGS. 10A, 10B, and 10C are respective views showing a method of selecting data using a latch result of a sensing node SO three times according to an exemplary embodiment of the inventive concept. FIG. 10A illustrates a data selection method in a case in which a threshold voltage of memory cells sensed through an OCVS read operation is located on a left side of a valley. FIG. 10B illustrates a data selection method in a case in which a threshold voltage of memory cells sensed through an OCVS read operation is located on a right side of a valley. FIG. 10C illustrates a data selection method in a case in which a threshold voltage of memory cells having been sensed is distributed based on a valley.

Referring to FIGS. 10A, 10B, and 10C, according to an OCVS read operation for identifying two states S1 and S2 of a memory cell, a level of a threshold voltage of a memory cell stored in latch sets may be modeled. When latching is performed at different develop timings, or a read voltage having different levels is provided, a threshold voltage position of memory cells may appear as a scatter diagram. For example, under the same read voltage condition, a state of the sensing node SO latched by each of the first latch signal LTCH_1, the second latch signal LTCH_2, and the third latch signal LTCH_3 may match data sensed by each of read voltages ①, ②, and ③ corresponding to a read signal and stored. Latch results corresponding to respective read voltages ①, ②, and ③ corresponding to a read signal are referred to as a first latch set (1st latch set), a second latch set (2nd latch set), and a third latch set (3rd latch set). For example, the first latch set (1st latch set), the second latch set (2nd latch set), and the third latch set (3rd latch set) indicate latches storing data latched by the first latch signal LTCH_1, the second latch signal LTCH_2, and the third latch signal LTCH_3, from among a plurality of latch sets.

Under these assumptions, memory cells in which a threshold voltage is located between a read voltage ① and a read voltage ② may be counted by comparing a first latch set with a second latch set. For example, when data latched in a first latch set and a second latch set are processed by an exclusive-OR (XOR) operation, the number (nC1) of memory cells in which a threshold voltage is located between levels of a read voltage ① and a read voltage ② may be counted. In a similar manner, the number (nC2) of memory cells in which a threshold voltage is located between levels of a read voltage ② and a read voltage ③ may be counted. The count operation described above may be performed in the cell counter 170 illustrated in FIG. 1.

When the numbers nC1 and nC2 of memory cells are counted, the control logic 150 may compare a difference value (|nC1−nC2|) of the number (nC1) of first memory cells and the number (nC2) of second memory cells with a first reference value A. When the difference value (|nC1−nC2|) is equal to or greater than the first reference value A, the number (nC1) of counted first memory cells and the number (nC2) of counted second memory cells may be compared with each other. According to a comparison result of the number (nC1) of first memory cells and the number (nC2) of second memory cells, data stored in one of a first latch set (1st latch set) and a third latch set (3rd latch set) may be selected. When the number (nC1) of counted first memory cells and the number (nC2) of counted second memory cells is equal to or greater than a second reference value B, a read fail is determined, and read recovery may be performed. In addition, when the difference value (|nC1−nC2|) is lower than the first reference value A, data stored in a second latch set (2nd latch set) may be selected. In this case, one of the number (nC1) of counted first memory cells and the number (nC2) of counted second memory cells may be output without comparison with the second reference value B. For example, when the difference value (|nC1−nC2|) is lower than the first reference value A, one of the number (nC1) of first counted memory cells and the number (nC2) of second counted memory cells may be output without comparison with the second reference value B, so the first reference value A may define an error exclusion range.

Referring to FIG. 10A, the control logic 150 may select a latch set corresponding to a level of a read voltage ③ when a difference value (|nC1−nC2|) is equal to or greater than a first reference value A and is lower than a second reference value B, while the number (nC1) of cells is determined to be greater than the number (nC2) of cells. For example, a read result corresponding to a valley may be determined as data stored in a third latch set (3rd latch set).

Referring to FIG. 10B, the control logic 150 may select a latch set corresponding to a level of a read voltage ① when a difference value (|nC1−nC2|) is equal to or greater than a first reference value A and is lower than a second reference value B, while the number (nC2) of cells is determined to be greater than the number (nC1) of cells. For example, a read result corresponding to a valley may be determined as data stored in a first latch set (1st latch set).

Referring to FIG. 10C, the control logic 150 may select a latch set corresponding to a level of a read voltage ② when a difference value (|nC1−nC2|) is lower than a first reference value A. For example, the number (nC1) of counted cells and the number (nC2) of counted cells are the same or a difference therebetween is determined to be equal to or lower than a reference value. That is, a read result corresponding to a valley may be determined as data stored in a second latch set (2nd latch set).

FIGS. 11A, 11B, 11C, and 11D are respective views showing a method of selecting data using a latch result of a sensing node SO twice according to exemplary embodiments of the inventive concept. FIGS. 11A to 11D are similar to FIGS. 10A to 10C. Thus, for convenience of explanation, duplicate descriptions will be omitted and differences between FIGS. 11A to 11D and 10A to 10C will be primarily described.

When the number (nC0) of memory cells is counted, the control logic 150 may compare the number (nC0) of memory cells with the first reference value A and the second reference value B. The first reference value A may be lower than the second reference value B. When the number (nC0) of memory cells is equal to or greater than a second reference value B, it is determined as a read fail, and read recovery may be performed. The first reference value A is lower than the second reference value B, so the first reference value A may define an error exclusion range.

When the number (nC0) of memory cells is equal to or greater than the first reference value A and is lower than the second reference value B, the number (nC1) of counted first memory cells and the number (nC2) of counted second memory cells may be compared with each other. According to a comparison result of the number (nC1) of first memory cells and the number (nC2) of second memory cells, data stored in one of a first latch set (1st latch set) and a third latch set (3rd latch set) may be selected. In addition, when the number (nC0) of memory cells is lower than the first reference value A, data stored in one of a first latch set (1st latch set) and a second latch set (2nd latch set) may be selected.

Figure 11A:
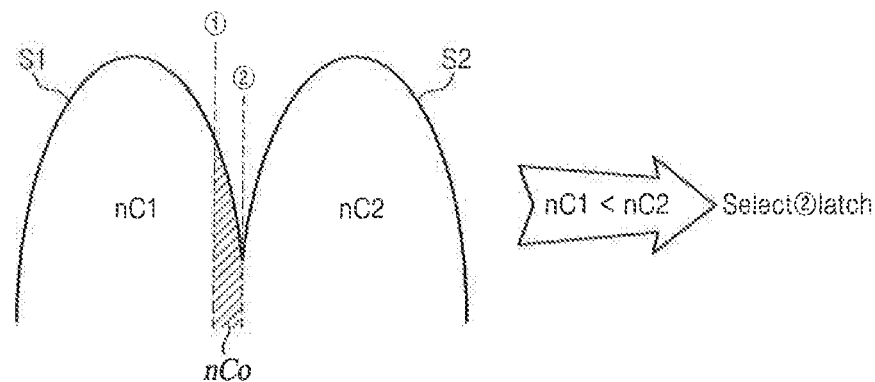
FIGS. 11A, 11B, 11C, and 11D are respective views showing a method of selecting data using a latch result of a sensing node SO twice.

Referring to FIG. 11A, the control logic 150 may select a latch set corresponding to a level of a read voltage ② when the number (nC0) of memory cells is equal to or greater than a first reference value A and is lower than a second reference value B, while the number (nC1) of cells is determined to be lower than the number (nC2) of cells. For example, a read result corresponding to a valley may be determined as data stored in a second latch set (2nd latch set).

Figure 11B:
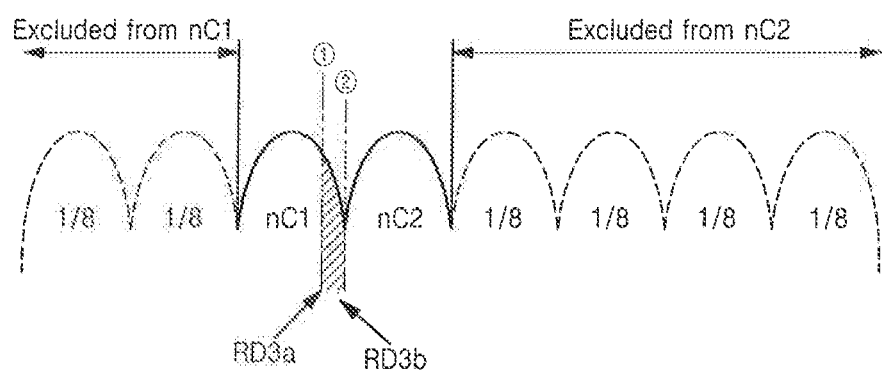

FIG. 11B illustrates a method of counting memory cells having a level equal to or lower than a specific level, or having a level equal to or greater than a specific level, in each of the states S1 and S2 described above. FIG. 11B illustrates a method of counting the number of memory cells included in a specific state, a target of an OCVS read operation in a multilevel cell (MLC) or a triple level cell (TLC).

Referring to FIG. 11B, the number (nC1) of memory cells may be calculated by subtracting the number (2/8) of memory cells allocated to two states from a read result (the number of on-cells) by a level of a read voltage C) (e.g., RD3a). Moreover, the number (nC2) of memory cells may be calculated by subtracting the number (4/8) of memory cells allocated to four states from a read result (the number of off-cells) by a level of a read voltage C) (e.g., RD3b).

Figure 11C:
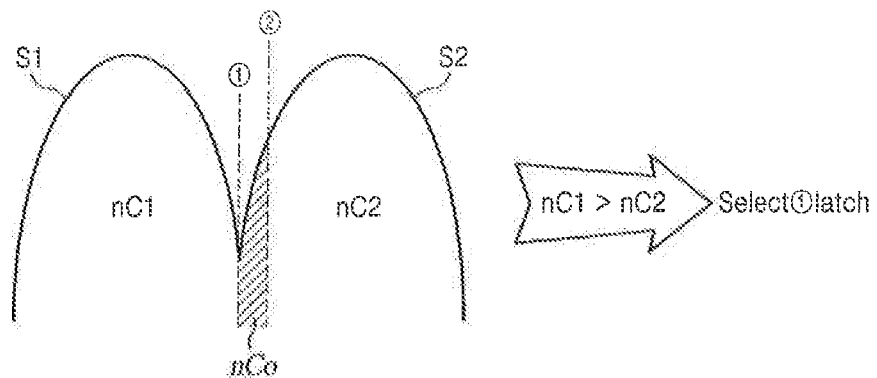

Referring to FIG. 11C, the control logic 150 may select a latch set corresponding to a level of a read voltage C) when the number (nC0) of memory cells is equal to or greater than a first reference value A and is lower than a second reference value B, while the number (nC1) of counted cells is greater than the number (nC2) of cells. For example, a read result corresponding to a valley may be determined as data stored in a first latch set (1st latch set).

Figure 11D:
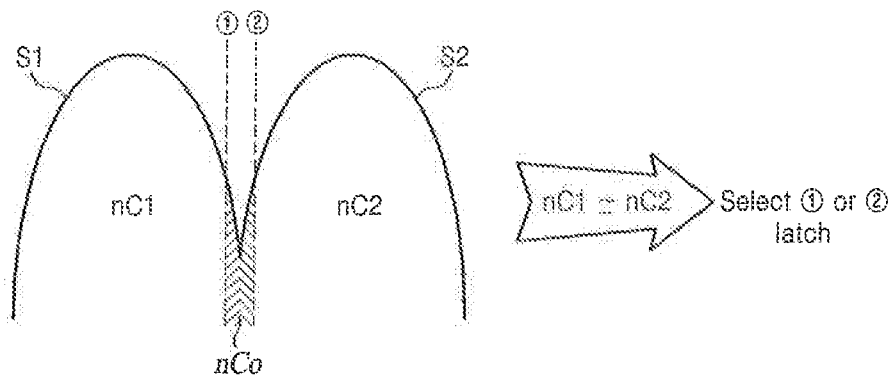

Referring to FIG. 11D, the control logic 150 may arbitrarily select and output one of a first latch set (1st latch set) or a second latch set (2nd latch set) when the number (nC0) of memory cells is lower than the first reference value A, that is, it is determined that the number (nC1) of cells and the number (nC2) of cells are the same or similar.

A read resolution of the OCVS read operation described above may be improved by performing further additional latch operations of sensing and storing data of selected memory cells. Through a greater number of latch operations, a latch result corresponding to an optimum valley may be derived. However, according to the number of latch sets included in a page buffer, the number of read operations due to a plurality of read signals is limited, so the number of latches cannot be excessively increased.

For example, as illustrated in FIGS. 10A to 10C, to identify a state of one memory cell when three latch operations are required, at least three latch sets are required. Moreover, to identify a state of one memory cell, as illustrated in FIGS. 11A to 11D, when two latch operations are required, at least two latch sets are required. Thus, to improve read resolution, when a plurality of sensing operations are required, a problem in which the number of latch sets corresponding to at least the plurality of sensing operations is required may occur.

Figure 12:
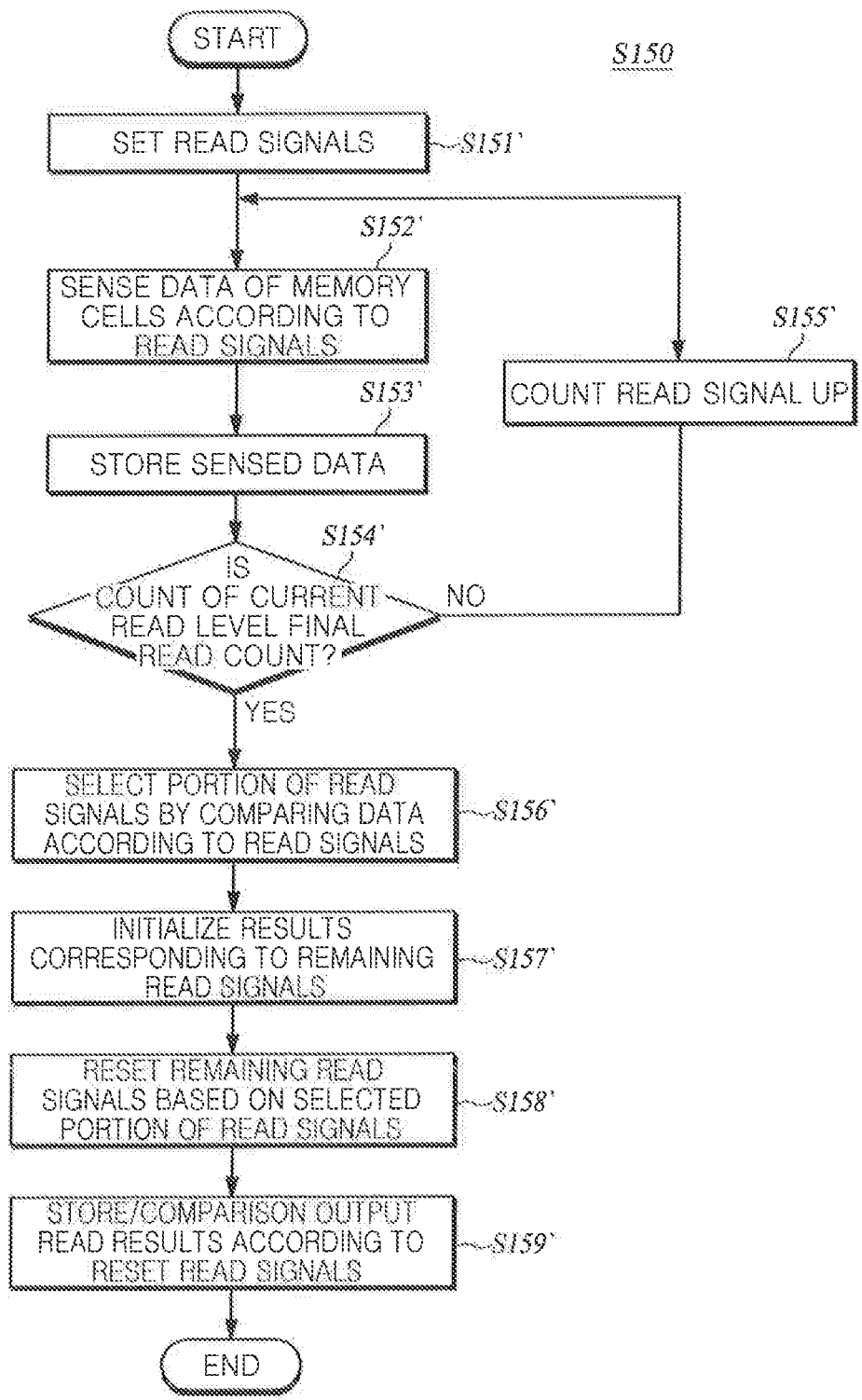
FIG. 12 is a flow diagram of an OCVS read operation according to an exemplary embodiment of the inventive concept.

FIG. 12 is a flow diagram of an OCVS read operation according to an exemplary embodiment of the inventive concept.

Referring to FIG. 12, the OCVS read operation illustrated in operation S150 of FIG. 5 is illustrated according to an exemplary embodiment. An OCVS read operation according to an exemplary embodiment of FIG. 12 is similar to an OCVS read operation according to an exemplary embodiment of FIG. 6. Thus, for convenience of explanation, duplicate descriptions will be omitted and differences between FIG. 12 and FIG. 6 will be primarily described.

An OCVS read operation of a memory device according to an exemplary embodiment includes a primary OCVS read operation and a secondary OCVS read operation. Here, each of the primary OCVS read operation and the secondary read operation corresponds to an operation for identifying a state of one memory cell of a plurality of selected memory cells (e.g., a single page datum). For example, a primary OCVS read operation corresponds to a read operation for identifying an erase state E0 and a program state P1 of a least significant bit (LSB) page, while a secondary OCVS read operation also corresponds to a read operation for identifying an erase state E0 and a program state P1 of a least significant bit (LSB) page.

Operations S151', S152', S153', S154', and S155' of an OCVS read operation according to the exemplary embodiment of FIG. 12 are similar to operations S151, S152, S153, S154, and S155 of an OCVS read operation according to the exemplary embodiment of FIG. 6. However, operations S151', S152', S153', S154', and S155' of an OCVS read operation according to the exemplary embodiment of FIG. 12 may be understood as a primary OCVS read operation, operations S156', S157', and S158' may be understood as a reset operation of a read signal, and operation S159' may be understood as a secondary OCVS read operation, to be distinguished from operations which will described later.

For example, in operation S151', read signals for a primary OCVS read operation are set. A read signal for a primary OCVS read operation may be referred to as a primary read signal. Primary read signals may include information on read count for a primary OCVS read operation and an interval between levels of read signals.

In operation S152', according to primary read signals, data of selected memory cells are sensed. For example, according to the number of times read voltages are supplied and a voltage interval between read voltages, data of selected memory cells may be sensed. Alternatively, according to the number of times data latching is performed at different develop timings and a time interval between data latching operations, data of selected memory cells may be sensed.

In operation S153', data sensed according to primary read signals are stored in each of a plurality of latch sets. In operation S154', it is determined whether a count of a current primary read signal is a set final read count. The final read count may correspond to a value set in operation S151'. When a count of a read signal of a currently performed read operation is not a final read count, the method proceeds to operation S155'. Alternatively, when a read count of a read signal of a currently performed read operation corresponds to a final read count, the method proceeds to operation S156'.

In operation S155', a read signal is counted up. For a sensing and storing operation corresponding to the counted up read signal, operations S152' and S153' are performed again.

In operation S156', by comparing data according to primary read signals, a portion of the primary read signals is selected. Here, the portion of the selected primary read signals may correspond to read signals corresponding to optimal reading results determined by counting the memory cells described previously. For example, the portion of the selected primary read signals may correspond to some primary read signals in which a level of a read voltage ③ in FIG. 10A, a level of a read voltage ② in FIG. 10B, and a level of a read voltage ① of FIG. 10C are selected.

In operation S157', data of memory cells corresponding to remaining primary read signals that have not been selected are initialized in a latch set. For example, in operation S153', results corresponding to remaining primary read signals that have not been selected, which are included among reading results stored in a plurality of latch sets, may be removed from the latch set. For example, results corresponding to read voltages ① and ② in FIG. 10A, results corresponding to read voltages ① and ③ in FIG. 10B, and results corresponding to read voltages ② and ③ in FIG. 10C may be removed from the latch sets.

In operation S158', based on the portion of selected primary read signals, remaining primary read signals that have not been selected are reset. For example, the remaining primary read signals that have not been selected are replaced with a subordinate read signal distributed based on the portion of the selected primary read signals, and the remaining primary read signals are reset. Here, the portion of selected primary read signals, and the reset subordinate read signals, may be used as a secondary read signal for a secondary OCVS read operation. Here, the number of the reset subordinate read signals may be determined by the number of latch sets. For example, the sum of the number of the portion of selected primary read signals, and the number of the reset subordinate read signals, cannot exceed the number of latch sets. Thus, the number of the reset subordinate read signals is limited by the number of latch sets. Alternatively, the number of the reset subordinate read signals is also set the same as the number of the remaining primary read signals that have not been selected.

In operation S159', according to a secondary read signal reset for a secondary OCVS read operation, a read operation similar to the primary OCVS read operation is performed, thereby storing read results derived therefrom, comparing the read results, and outputting the read results. In the secondary OCVS read operation, results of read operations according to the reset subordinate read signals may be stored in a latch set that has been initialized. Alternatively, according to an exemplary embodiment, in a resetting operation, an OCVS algorithm may proceed using a method in which read results corresponding to primary read signals that have not been selected are not initialized, while read results corresponding to primary read signals are replaced with read results corresponding to subordinate read signals sensed in a secondary OCVS read operation.

Figure 13A:
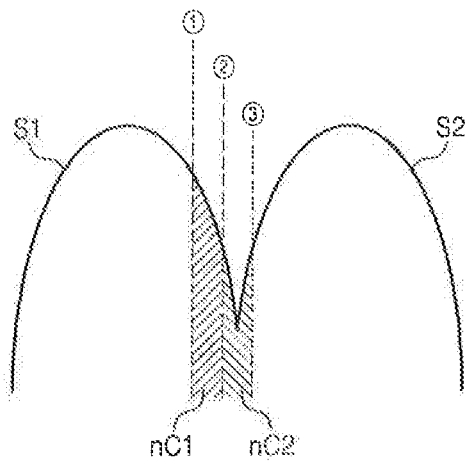
FIGS. 13A and 13B are views provided to illustrate an OCVS read operation according to an exemplary embodiment of FIG. 12.
Figure 13B:
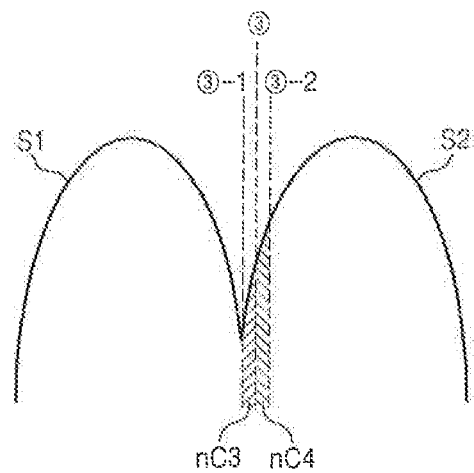

FIGS. 13A and 13B are views provided to illustrate an OCVS read operation according to the exemplary embodiment of FIG. 12. FIGS. 13A and 13B illustrate a method of selecting data using a latch result of a sensing node SO three times.

FIGS. 13A and 13B illustrate a data selection method in a case in which a threshold voltage of memory cells sensed through a primary OCVS read operation and a secondary OCVS read operation is located on a left side of a valley.

Referring to FIG. 13A, as illustrated in detail in the description corresponding to FIG. 10A, it is determined that the number (nC1) of cells is greater than the number (nC2) of cells, so a third latch set (3rd latch set) corresponding to a read voltage ③ may be calculated as a read result corresponding to a valley.

According to an exemplary embodiment, a read voltage ③ may be selected from among read voltages ①②③, and read results corresponding to the remaining read voltages ①② may be initialized in latch sets. Alternatively, a read result corresponding to a read voltage ③ may be maintained in a latch set.

Referring to FIG. 13B, when a read voltage ③ is selected, the remaining read voltages ① and ② that have not been selected may be reset based on the read voltage ③. Here, the read voltages ① and ② may be reset as read voltages ③-1 and ③-2 distributed based on the read voltage ③. An interval from among the read voltage ①, the read voltage ③-1, and the read voltage ③-2 may be narrower than an interval from among the read voltages ①, ②, and ③. Thus, compared to a primary OCVS read operation, a secondary OCVS read operation may accurately determine a valley. In FIG. 13B, a read voltage ③-1 and a read voltage ③-2 are illustrated as being distributed with the read voltage ③ interposed therebetween. However, alternatively, the read voltage ③-1 and the read voltage ③-2 may be distributed in order based on the read voltage ③.

Referring to FIG. 13B, as illustrated in detail in the description corresponding to FIG. 10C, it is determined that the number (nC4) of cells is greater than the number (nC3) of cells, so a latch set corresponding to a read voltage ③-1 may be calculated as a read result corresponding to a valley.

Figure 14:
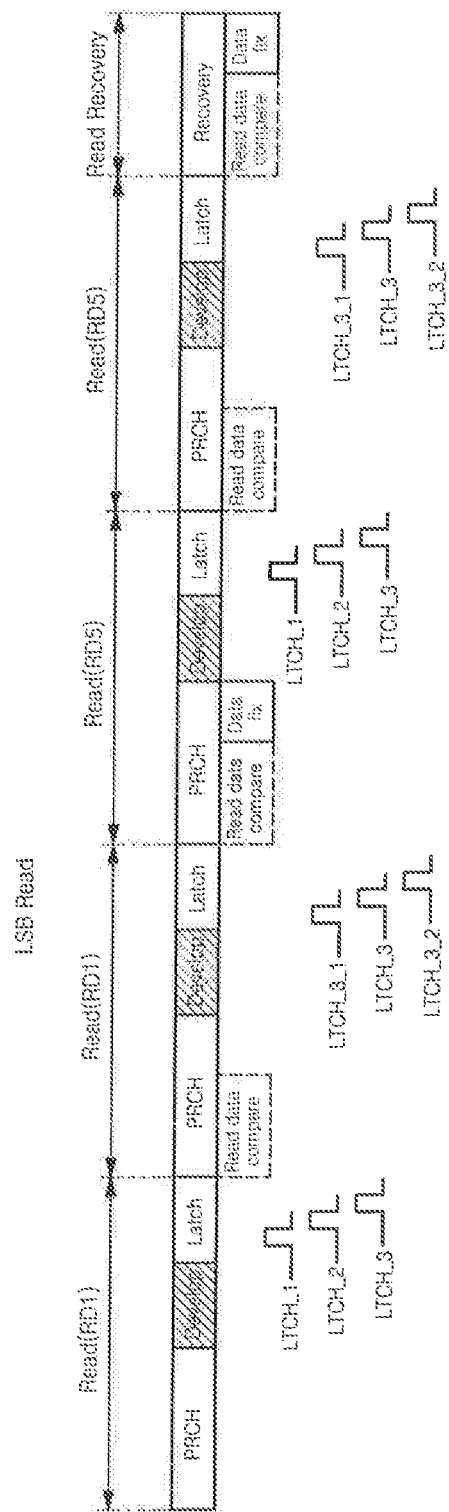
FIG. 14 is an application table of multiple OCVS read operations according to an exemplary embodiment of the inventive concept.

FIG. 14 is an application table of multiple OCVS read operations according to an exemplary embodiment of the inventive concept.

Referring to FIG. 14, to identify an erase state E0 and a program state P1 of a least significant bit (LSB) page, a primary OCVS read operation and a secondary OCVS read operation by a read voltage RD1 may be performed.

First, for a primary OCVS read operation by a read voltage RD1, a bit line and a sensing node SO of selected memory cells are precharged. In addition, latch signals LTCH_1, LTCH_2, and LTCH_3 may be sequentially provided at different timings of a section in which the sensing node SO is developed. Data of selected memory cells may be stored in different latch sets by respective latch signals LTCH_1, LTCH_2, and LTCH_3.

Then, a secondary OCVS read operation by a read voltage RD1 may be performed. A bit line and a sensing node SO of selected memory cells may be precharged (PRCH) under conditions of the read voltage RD1. In a precharge section, a comparison operation of latch sets stored during a primary OCVS read operation performed previously may be performed. In the case that a read signal corresponding to a latch signal LTCH_3 is selected, data may be stored in different latch sets by latch signals LTCH_3_1, LTCH_3, and LTCH_3_2, provided at different time timings of a develop section.

Then, to identify a program state P4 and a program state P5 of a least significant bit (LSB) page, a primary OCVS read operation and a secondary OCVS read operation by a read voltage RD5 may be performed.

First, for a primary OCVS read operation by a read voltage RD5, a bit line and a sensing node SO of selected memory cells are precharged (PRCH). In a precharge section, a final comparison and selection operation of latch sets stored during a secondary OCVS read operation under conditions of a read voltage RD1 may be performed. In addition, latch signals LTCH_1, LTCH_2, and LTCH_3 may be sequentially provided at different timings of a section in which the sensing node SO is developed. By respective latch signals LTCH_1, LTCH_2, and LTCH_3, data of selected memory cells may be stored in different latch sets.

Then, a secondary OCVS read operation by a read voltage RD5 may be performed. A bit line and a sensing node SO of selected memory cells may be precharged (PRCH) under conditions of the read voltage RD1. In a precharge section, a comparison operation of latch sets stored during a primary OCVS read operation performed previously may be performed. In the case that a read signal corresponding to a latch signal LTCH_3 is selected, data may be stored in different latch sets by latch signals LTCH_3_1, LTCH_3, and LTCH_3_2, provided at different timings of a develop section, after the develop section.

When data are stored in different latch sets by latch signals LTCH_3_1, LTCH_3, and LTCH_3_2, in addition to read recovery, a data comparison and selection operation may be performed in a pipelined manner. In a read recovery section, a bit line and the sensing nodes SO may be restored to an initial voltage level. In this case, under conditions of a read voltage RD5, one data set from among a plurality of data sets latched by each of latch signals LTCH_3_1, LTCH_3, and LTCH_3_2 may be selected through a comparison operation. In addition, by processing a secondary OCVS read operation result by the read voltage RD1 and a secondary OCVS read operation result by the read voltage RD7, least significant bit (LSB) data may be determined.

Figure 15:
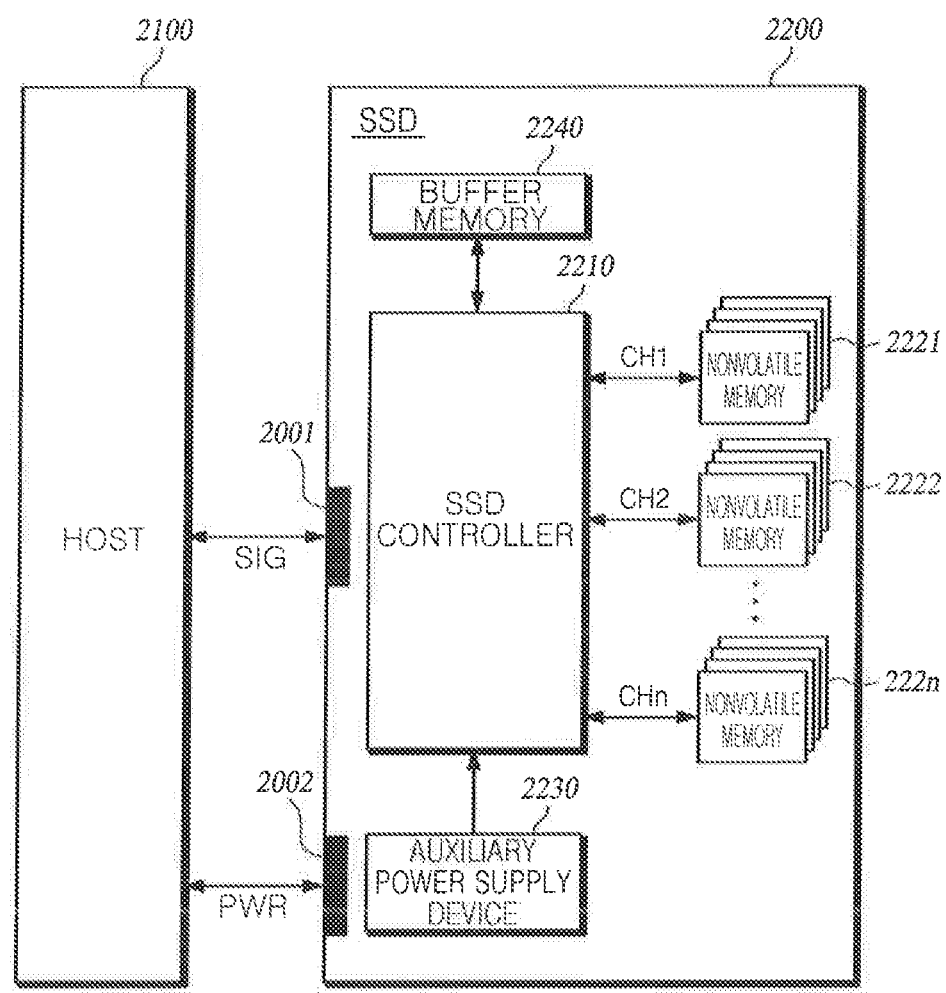
FIG. 15 is a block diagram illustrating an exemplary Solid State Drive (SSD) system to which a non-volatile memory system according to exemplary embodiments of the present inventive concept is applied.

FIG. 15 is a block diagram illustrating an exemplary Solid State Drive (SSD) system to which a non-volatile memory system according to exemplary embodiments of the present inventive concept is applied.

Referring to FIG. 15, in an exemplary embodiment, an SSD system 2000 includes a host 2100 and an SSD 2200. The SSD 2200 may send and receive a signal SIG with the host 2100 through a signal connector 2001, and may receive power (PWR) through a power connector 2002. The SSD 2200 may include an SSD controller 2210, a plurality of flash memories 2221 to 222n, an auxiliary power supply device 2230, and a buffer memory 2240.

The SSD controller 2210 may control the plurality of flash memories 2221 to 222n in response to the signal SIG received from the host 2100.

The auxiliary power supply device 2230 may be connected to the host 2100 through the power connector 2002. The auxiliary power supply device 2230 may receive power (PWR) from the host 2100, and may be charged. The auxiliary power supply device 2230 may provide power of the SSD system 2000 when power supply from the host 2100 is not stable. The auxiliary power supply device 2230 may be located in the SSD 2200 or outside the SSD 2200. For example, the auxiliary power supply device 2230 may be located in a mainboard and may provide auxiliary power to the SSD 2200.

The buffer memory 2240 may be operated as a buffer memory of the SSD 2200. For example, the buffer memory 2240 may temporarily store data received from the host 2100 or data received from the plurality of flash memories 2221 to 222n, or may temporarily store metadata of the flash memories 2221 to 222n (e.g., a mapping table). The buffer memory 2240 may include volatile memories such as, for example, DRAM, SDRAM, DDR SDRAM, LPDDR SDRAM, SRAM, etc., or nonvolatile memories such as, for example, FRAM ReRAM, STT-MRAM, PRAM, etc.

As set forth above, according to exemplary embodiments of the present inventive concept, to identify a specific data state in a non-volatile memory device, a plurality of primary read signals is provided in a primary sensing procedure, and a plurality of secondary read signals is provided in a secondary sensing procedure, thereby outputting optimal data corresponding to a valley.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies.

While the present inventive concept has been particularly shown and described with reference to the exemplary embodiments thereof, it will be apparent to those skilled in the art that modifications and variations may be made without departing from the scope of the present inventive concept as defined by the following claims.

What is claimed is:

1. A non-volatile memory device, comprising:
a page buffer comprising a plurality of latch sets that latches first results of a plurality of first read operations according to a plurality of read signals,
wherein the first read operations identify a single page datum from among a plurality of page data of selected memory cells included in a plurality of memory cells; and
a control logic that selects a portion of the read signals by comparing the first results of the first read operations with one another, and that resets remaining read signals that are not selected to an initial read voltage level,
wherein the page buffer stores second results of second read operations according to the selected read signals, and third results of third read operations according to the reset remaining read signals,
wherein a number of the reset read signals is determined by a number of the latch sets.

2. The non-volatile memory device of claim 1, wherein the page buffer initializes the first results of the first read operations according to the remaining read signals before the remaining read signals are reset.

3. The non-volatile memory device of claim 1, wherein the page buffer replaces the first results of the first read operations, before the remaining read signals are reset, with the third results of the third read operations according to the reset remaining read signals.

4. The non-volatile memory device of claim 1, wherein a sum of the number of the reset read signals and a number of the selected read signals corresponds to the number of the latch sets.

5. The non-volatile memory device of claim 1, wherein the number of the reset read signals is equal to a number of the remaining read signals.

6. A non-volatile memory device, comprising:
a page buffer comprising a plurality of latch sets that sequentially performs primary read operations and secondary read operations according to primary read signals and secondary read signals, and that latches first results of the primary read operations and the secondary read operations,
wherein the latch sets identify a single page datum from among a plurality of page data of selected memory cells included in a plurality of memory cells; and
a control logic that selects a portion of the primary read signals by comparing the first results of the primary read operations with one another, and that determines the secondary read signals based on the selected primary read signals,
wherein the page buffer initializes second results of the primary read operations corresponding to remaining primary read signals that have not been selected.

7. The non-volatile memory device of claim 6, wherein the secondary read signals comprise the selected primary read signals and subordinate read signals distributed based on the selected primary read signals.

8. The non-volatile memory device of claim 7, wherein the page buffer replaces the second results of the primary read operations corresponding to the remaining primary read signals with third results of read operations corresponding to the subordinate read signals.

9. The non-volatile memory device of claim 7, wherein a number of the subordinate read signals is limited by a number of the latch sets.

10. The non-volatile memory device of claim 6, wherein the page buffer performs the primary read operations at different timings determined according to the primary read signals, and performs the secondary read operations at different timings determined according to the secondary read signals.

11. The non-volatile memory device of claim 10, wherein an identical read voltage is provided to a word line of the selected memory cells while the primary read operations and the secondary read operations are performed.

12. The non-volatile memory device of claim 6, wherein the page buffer performs the primary read operations by providing first read voltages having different levels determined according to the primary read signals to a word line of the selected memory cells, and performs the secondary read operations by providing second read voltages having different levels determined according to the secondary read signals to the word line of the selected memory cells.

13. The non-volatile memory device of claim 6, wherein the page buffer comprises a first latch set and a second latch set that latch a result of each of a first read operation and a second read operation from among the primary read operations and the secondary read operations, and
the control logic selects one of the first latch set and the second latch set.

14. The non-volatile memory device of claim 13, wherein the control logic compares a number of on-cells counted according to the first latch set with a number of off-cells counted according to the second latch set, and selects one of the first latch set and the second latch set according to a comparison result.

15. The non-volatile memory device of claim 6, wherein the page buffer comprises a first latch set, a second latch set, and a third latch set that latch a result of each of a first read operation, a second read operation, and a third read operation from among the primary read operations and the secondary read operations, and
the control logic selects one of the first latch set, the second latch set, and the third latch set.

16. The non-volatile memory device of claim 15, wherein the control logic compares a first cell count counted according to the first latch set and the second latch set with a second cell count counted according to the second latch set and the third latch set, and selects one of the first latch set, the second latch set, and the third latch set according to a comparison result.

17. A reading method of a non-volatile memory device, comprising:

storing first results of primary read operations that identify a single page datum from among a plurality of page data of selected memory cells according to primary read signals;

selecting a portion of the primary read signals, and determining secondary read signals based on the selected primary read signals by comparing the first results of the primary read operations with one another;

initializing second results of the primary read operations corresponding to remaining primary read signals that have not been selected; and storing third results of secondary read operations that identify the single page datum from among the plurality of page data according to the secondary read signals.

18. The reading method of the non-volatile memory device of claim 17, wherein the secondary read signals comprise the selected primary read signals and subordinate read signals distributed based on the selected primary read signals.

19. The reading method of the non-volatile memory device of claim 18, wherein a number of the subordinate read signals is determined according to a number of a plurality of latch sets that store the first results of the primary read operations and the third results of the secondary read operations.

* * * * *